US009750140B2

(12) United States Patent
Chen et al.

(10) Patent No.: US 9,750,140 B2
(45) Date of Patent: Aug. 29, 2017

(54) DISPLAY DEVICE

(71) Applicant: InnoLux Corporation, Miao-Li County (TW)

(72) Inventors: Hung-Kun Chen, Miao-Li County (TW); Po-Hung Shen, Miao-Li County (TW); Hui- Min Huang, Miao-Li County (TW); Shih-Hsiung Wu, Miao-Li County (TW); Jui-Chu Lai, Miao-Li County (TW); Huan-Kuang Peng, Miao-Li County (TW); Hong-Kang Chang, Miao-Li County (TW); Yu-Chien Kao, Miao-Li County (TW); Li-Wei Sung, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 38 days.

(21) Appl. No.: 14/656,387

(22) Filed: Mar. 12, 2015

(65) Prior Publication Data
US 2015/0264805 A1 Sep. 17, 2015

Related U.S. Application Data

(60) Provisional application No. 61/952,929, filed on Mar. 14, 2014, provisional application No. 61/976,203, (Continued)

(30) Foreign Application Priority Data

Sep. 24, 2014 (TW) .............. 103132928 A
Sep. 25, 2014 (TW) .............. 103133162 A
Oct. 28, 2014 (TW) .............. 103137142 A

(51) Int. Cl.
H05K 1/00 (2006.01)
H05K 1/18 (2006.01)
(Continued)

(52) U.S. Cl.
CPC ......... *H05K 3/0052* (2013.01); *G02F 1/1339* (2013.01); *G02F 1/13394* (2013.01);
(Continued)

(58) Field of Classification Search
USPC .......................................... 361/748, 760, 761
See application file for complete search history.

(56) References Cited

U.S. PATENT DOCUMENTS 6,683,671 B1   1/2004   Morimoto
6,870,591 B2   3/2005   Lee et al.
(Continued)

FOREIGN PATENT DOCUMENTS

CN   102346339   2/2012
CN   102749731   10/2012
(Continued)

OTHER PUBLICATIONS

Chinese language office action dated Dec. 10, 2015, issued in application No. TW 103140591.
(Continued)

Primary Examiner — Andargie M Aychillhum
(74) Attorney, Agent, or Firm — McClure, Qualey & Rodack, LLP

(57) ABSTRACT

The disclosure provides a display device including a first substrate, a display region disposed above the first substrate; a second substrate; a sealant disposed between the first substrate and the second substrate and outside the display region; and, a plurality of spacers disposed within the sealant. In particular, the first substrate and the second substrate are bonded together via the sealant. Further, the first substrate has a side wall including a first cutting crack surface and a first median crack surface, wherein a roughness of the first cutting crack surface is different from that of the first median crack surface.

18 Claims, 30 Drawing Sheets

Related U.S. Application Data filed on Apr. 7, 2014, provisional application No. 61/989,046, filed on May 6, 2014, provisional application No. 62/019,993, filed on Jul. 2, 2014.

(51) Int. Cl.

| | | |
|---|---|---|
| *H05K 7/00* | (2006.01) | |
| *H05K 3/00* | (2006.01) | |
| *H01L 51/52* | (2006.01) | |
| *G02F 1/1339* | (2006.01) | |
| *H05K 1/14* | (2006.01) | |
| *G02F 1/1333* | (2006.01) | |

(52) U.S. Cl.
CPC ........ *H01L 51/525* (2013.01); *H01L 51/5246* (2013.01); *G02F 1/133351* (2013.01); *G02F 2001/133388* (2013.01); *H05K 1/144* (2013.01); *H05K 2201/09154* (2013.01); *H05K 2201/10128* (2013.01); *H05K 2201/2018* (2013.01); *H05K 2201/2036* (2013.01); *Y10T 428/24355* (2015.01)

(56) References Cited

U.S. PATENT DOCUMENTS

| | | | |
|---|---|---|---|
| 7,379,142 B2 | 5/2008 | Tak et al. | |
| 7,508,481 B2 | 3/2009 | Whitehead, Jr. et al. | |
| 7,924,393 B2 | 4/2011 | Fukuoka et al. | |
| 8,704,762 B2 * | 4/2014 | Anno | G06F 3/041 345/156 |
| 9,151,994 B2 | 10/2015 | Chang et al. | |
| 9,176,339 B2 | 11/2015 | Kim et al. | |
| 2002/0140887 A1 | 10/2002 | Maeda et al. | |
| 2005/0157245 A1 | 7/2005 | Lin et al. | |
| 2006/0209235 A1 | 9/2006 | Kim | |
| 2006/0284643 A1 | 12/2006 | Yamamoto et al. | |
| 2008/0170195 A1 | 7/2008 | Kwon et al. | |
| 2009/0273749 A1 | 11/2009 | Miyamoto et al. | |
| 2009/0310051 A1 | 12/2009 | Kim | |
| 2011/0025940 A1 | 2/2011 | Liu et al. | |
| 2012/0268708 A1 * | 10/2012 | Chida | G02F 1/133351 349/153 |
| 2012/0327338 A1 | 12/2012 | Kobayashi et al. | |
| 2013/0342795 A1 | 12/2013 | Park et al. | |
| 2014/0029230 A1 | 1/2014 | Oh et al. | |
| 2014/0225849 A1 | 8/2014 | Anno et al. | |

FOREIGN PATENT DOCUMENTS

| | | |
|---|---|---|
| CN | 103513470 | 1/2014 |
| JP | 2003-66467 | 3/2003 |
| JP | 2006-171386 | 6/2006 |
| JP | 3946498 | 7/2007 |
| TW | 200527679 | 8/2005 |
| TW | 200712614 | 4/2007 |
| TW | 201005360 | 2/2010 |
| TW | I335482 | 1/2011 |
| TW | 201202812 | 1/2012 |
| TW | 201307945 | 2/2013 |
| TW | 201321851 | 6/2013 |
| TW | I408471 | 9/2013 |

OTHER PUBLICATIONS

Chinese language office action dated Oct. 15, 2015, issued in application No. TW 103141941.
Chinese language office action dated Nov. 10, 2015, issued in application No. TW 103133162.
Office Action dated Apr. 12, 2016, issued in U.S. Appl. No. 14/643,169 (copy not provided).
Office Action dated Apr. 13, 2016, issued in U.S. Appl. No. 14/656,363 (copy not provided).
Office Action dated Apr. 5, 2016, issued in U.S. Appl. No. 14/656,461 (copy not provided).
Chinese language office action dated Dec. 16, 2015, issued in application No. TW 103137142.
Chinese language office action dated Dec. 28, 2015, issued in application No. TW 103137140.
Chinese language office action dated Mar. 1, 2016, issued in application No. TW 103132928.

* cited by examiner

DISPLAY DEVICE

CROSS REFERENCE TO RELATED APPLICATIONS

This application claims priority of Taiwan Application Serial Number 103132928, filed on Sep. 24, 2014, Taiwan Application Serial Number 103133162, filed on Sep. 25, 2014, Taiwan Patent Application No. 103137142, filed on Oct. 28, 2014, U.S. Provisional Application No. 61/952,929, filed on Mar. 14, 2014, U.S. Provisional Application No. 61/976,203, filed on Apr. 7, 2014, U.S. Provisional Application No. 61/989,046, filed on May 6, 2014, and U.S. Provisional Application No. 62/019,993, filed on Jul. 2, 2014, the entireties of which are incorporated by reference herein.

BACKGROUND

Technical Field

The disclosure relates to a display device, and in particular to a display device having a stable cutting region.

Description of the Related Art

As digital technology develops, display devices are becoming more popularly used in our society. For example, display devices have been applied to modern information and communication devices such as televisions, notebook PCs, computers, mobile phones and smartphones. In addition, each generation of display devices has been developed to be thinner, lighter, smaller and more fashionable.

In the manufacturing process of conventional display devices, after the formation of an array substrate and a color filter substrate, the array substrate and the color filter substrate are bonded together via a sealant to obtain a display device main substrate, and the display device main substrate is subjected to a cutting process along a predetermined cutting line. However, the array substrate and the color filter substrate in an area near the predetermined cutting line are separated and supported merely by sealant. Due to the poor supporting reliability of the sealant, the cutting precision of the cutting process is reduced and the cutting crack of the substrate is shallow, resulting in a decrease in the yield.

SUMMARY

The disclosure provides a display device including a first substrate, wherein a display region is disposed above the first substrate; a second substrate disposed opposite to the first substrate; a sealant disposed between the first substrate and the second substrate and outside the display region, wherein the first substrate and the second substrate are bonded together via the sealant; and a plurality of spacers disposed within the sealant. The first substrate has a side wall including a first cutting crack surface and a first median crack surface, and the roughness of the first cutting crack surface is different from that of the first median crack surface.

According to other embodiments of the disclosure, the display device of the disclosure includes a first substrate, wherein a display region is disposed above the first substrate; a second substrate; a sealant disposed between the first substrate and the second substrate and outside the display region, wherein the first substrate and the second substrate are bonded together via the sealant; a first contacting pad and a second contacting pad disposed on the first substrate and outside the display region; a test circuit disposed along edges of the first substrate, wherein the edges of the first substrate are substantially coincided with edges of the second substrate, and the first contacting pad is electrically connected to the second contacting pad via the test circuit; and, a first circuit and a second circuit, wherein the first circuit electrically connects to the first contacting pad, and the second circuit electrically connects to the second contacting pad, wherein the first circuit and the second circuit are disposed on a circuit board.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
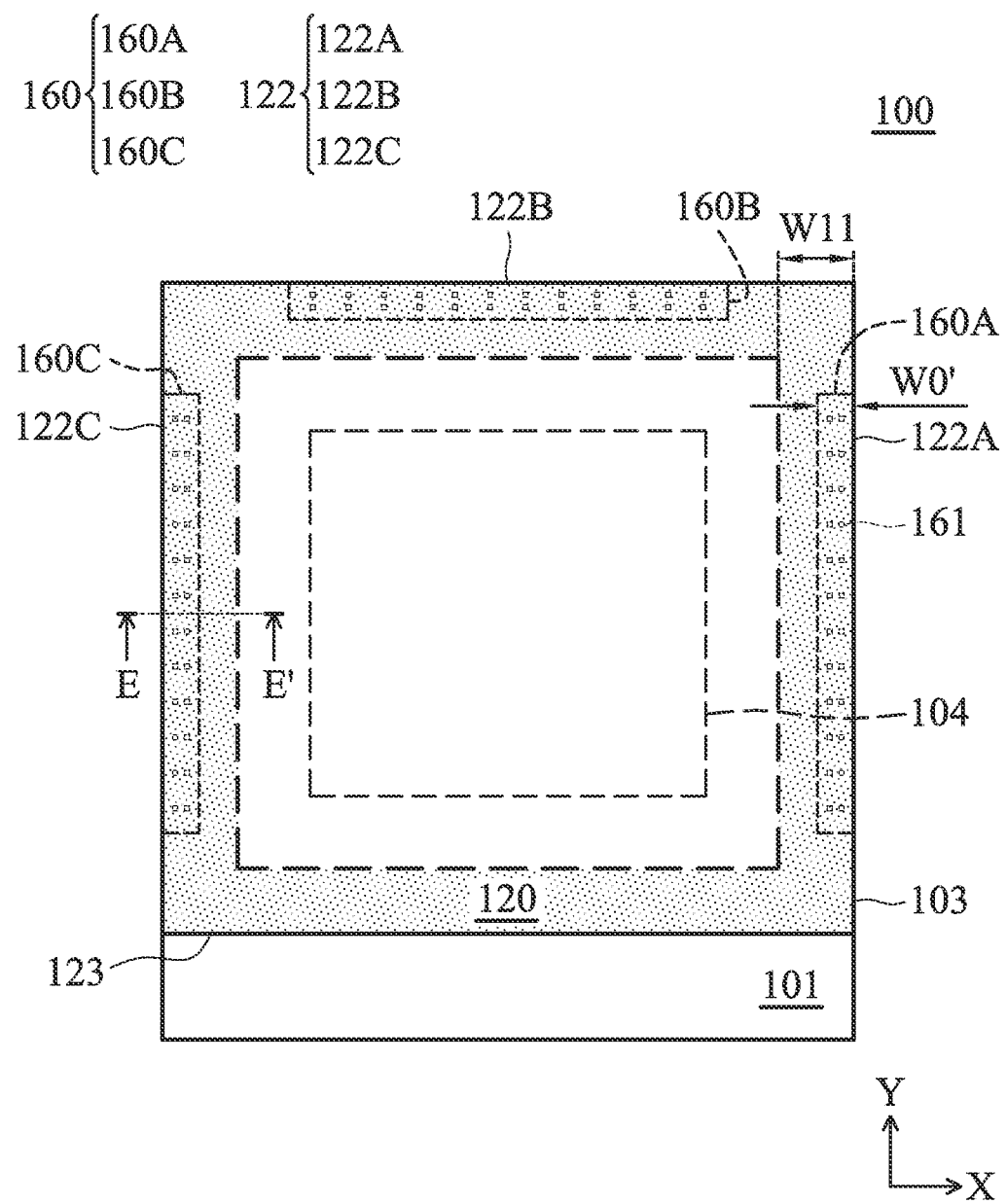
FIG. 1 is a top-view of a display device according to an embodiment of the disclosure.

The display device of the disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first layer disposed on a second layer", may indicate not only the direct contact of the first layer and the second layer, but also a non-contact state with one or more intermediate layers between the first layer and the second layer. In the above situation, the first layer may not directly contact the second layer.

It should be noted that the elements or devices in the drawings of the disclosure may be present in any form or configuration known to those skilled in the art. In addition, the expression "a layer overlying another layer", "a layer is disposed above another layer", "a layer is disposed on another layer" and "a layer is disposed over another layer" may refer to a layer that directly contacts the other layer, and they may also refer to a layer that does not directly contact the other layer, there being one or more intermediate layers disposed between the layer and the other layer.

The drawings described are only schematic and are non-limiting. In the drawings, the size, shape, or thickness of some of the elements may be exaggerated and not drawn on scale for illustrative purposes. The dimensions and the relative dimensions do not correspond to actual location to practice of the disclosure. The disclosure will be described with respect to particular embodiments and with reference to certain drawings but the disclosure is not limited thereto.

Moreover, the use of ordinal terms such as "first", "second", "third", etc., in the disclosure to modify an element does not by itself connote any priority, precedence, or order of one claim element over another or the temporal order in which it is formed, but are used merely as labels to distinguish one claim element having a certain name from another element having the same name (but for use of the ordinal term) to distinguish the claim elements.

According to embodiments of the disclosure, the display device has spacers disposed on the stable cutting region for increasing structural stability during a cutting process. Therefore, side walls of the substrates of the display device have specific cutting crack surfaces, resulting in improving the cutting and breaking performance and reducing the substrate breakage rate. As a result, the yield of the display device can be improved.

In addition, according to embodiments of the disclosure, the display device of the disclosure can further include a test circuit disposed along predetermined cutting lines. Therefore, after the cutting process, the test circuit can be used to detect whether cutting shift is occurring on the display device.

FIG. 1 is a top-view of a display device according to an embodiment of the disclosure. The display device 100 includes a first substrate 101 and a second substrate 103, wherein the first substrate 101 is disposed opposite to the second substrate 103, and the first substrate 101 and the second substrate 103 are bonded together via a sealant 120. The first substrate 101 has a display region 104. The second substrate 103 has a stable cutting region 160, and the stable cutting region 160 corresponds to an area outside the display region 104 of the first substrate 101. Furthermore, the stable cutting region 160 is adjacent to the peripheral boundary 122 (including a first boundary 122A, a second boundary 122B, and a third boundary 122C) of the first substrate 101, on which a projection of the second substrate 103 is located. In addition, there is a substrate border 123 between the part of the first substrate 101 overlapped by the second substrate 103 and the part of the first substrate 101 not overlapped by the second substrate 103. The sealant 120 is disposed along the first boundary 122A, the second boundary 122B, the third boundary 122C, and the substrate border 123. Furthermore, the sealant 120 is disposed outside the display region 104.

The display device 100 can be a liquid-crystal display (such as a thin film transistor liquid-crystal display), or an organic light emitting device (such as an active organic light emitting device). The display region 104 can have a plurality of pixels (not shown). The first substrate 101 and the second substrate 103 can be quartz, glass, silicon, metal, plastic, or ceramic. Furthermore, the sealant 120 can be a resin.

According to an embodiment of the disclosure, there are a plurality of spacers 161 disposed within the stable cutting region 160. The sealant 120 can overlap a part of the spacers 161. For example, the sealant 120 overlaps five spacers 161, and others (five other spacers 161) are outside the sealant 120. In an embodiment of the disclosure, the sealant can cover all the spacers 161. For example, ten spacers are covered by the sealant. In other embodiments of the disclosure, at least part of the spacers are overlapped by the sealant and are adjacent to a liquid-crystal layer. For example, the sealant 120 overlaps five spacers 161, and each of the others is partially outside the sealant 120. The stable cutting region 160 can include a first stable region 160A, a second stable region 160B, and a third stable region 160C. The first stable region 160A, the second stable region 160B, and the third stable region 160C can be adjacent to the first boundary 122A, the second boundary 122B, and the third boundary 122C, respectively. It should be noted that, since there are a plurality of conductive lines (not shown) disposed across the substrate border 123 for electrically connecting the display region 104 to a driving element (such as an integrated circuit, not shown), the stable cutting region 160 is not disposed on the second substrate 103 along the substrate border 123. Namely, the stable cutting region 160 is not adjacent to the substrate border 123. In addition, the stable cutting region 160 is not in contact with four corners of the second substrate 103. Furthermore, any two of the first stable region 160A, the second stable region 160B, and the third stable region 160C do not contact each other, and alignment marks (not shown) for cutting can be disposed on the four angles of the second substrate 103. The spacers 161 can be made of a photoresist material, such as a positive photoresist material or a negative photoresist material. In one embodiment, the spacers can be formed by subjecting a photoresist layer to a patterning process. The patterning process can include the following steps: coating a photoresist layer, soft-baking, aligning mask, exposing, post-exposure baking, developing, and hard-baking.

According to an embodiment of the disclosure, the stable cutting region has a width between about 50 µm and 150 µm. The percentage ratio of the width W0' of the stable cutting region to the width W11 of the sealant can be between 6% and 50% (i.e. 6%≤W0'/W11≤50%). As shown in FIG. 1, the part of the stable cutting region 160, which is not occupied by the spacer 161, can be filled with the sealant 120.

Figure 2:
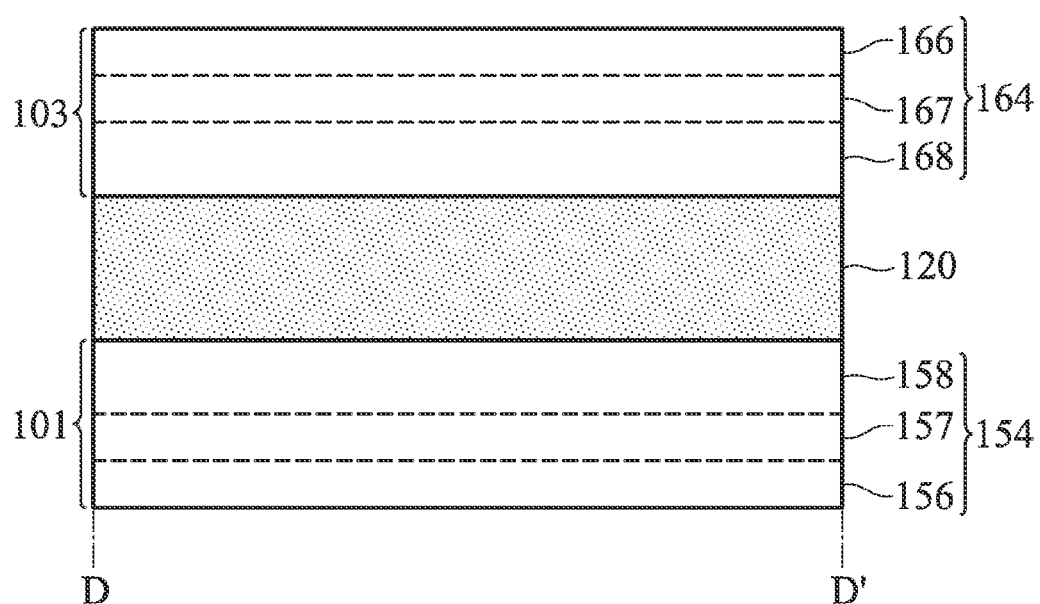
FIG. 2 is a schematic drawing of the display device of FIG. 1 in the X direction.

FIG. 2 is a schematic drawing of the display device of FIG. 1 in the X direction. According to embodiments of the disclosure, after cutting, the side walls of the first substrate 101 can have a first cutting crack surface 156, a first median crack surface 157, and a first pressure crack surface 158, wherein the first median crack surface 157 is disposed between the first cutting crack surface 156 and the first pressure crack surface 158. The first cutting crack surface 156 is a crack section formed by a cutter wheel and the first cutting crack surface 156 is disposed at a side of the first substrate far away from the sealant 120. The first median crack surface 157 is an extending section due to pressure from the cutter wheel. The first pressure crack surface 158 is a peeling section formed by external pressure during a peeling process. In an embodiment of the disclosure, if the side wall 154 has a relatively larger first median crack surface 157, the side wall 154 would merely have the first cutting crack surface 156 and the first median crack surface 157, and thus there is no first pressure crack surface 158 formed on the side wall 154. In particular, the roughness of the first cutting crack surface 156, the first median crack surface 157, and the first pressure crack surface 158 are different.

On the other hand, side walls 164 of the second substrate 103 can have a second cutting crack surface 166, a second median crack surface 167, and a second pressure crack surface 168, wherein the second median crack surface 167 is disposed between the second cutting crack surface 166 and the second pressure crack surface 168. The second cutting crack surface 166 is a crack section formed by a cutter wheel and the second cutting crack surface 166 is disposed at a side of the second substrate 103 far away from the sealant 120. The second median crack surface 167 is an extending section due to pressure from the cutter wheel. The second pressure crack surface 168 is a peeling section formed by external pressure during a peeling process. In an embodiment of the disclosure, if the side wall 164 has a relatively larger second median crack surface 167, the side wall 164 would merely have the second cutting crack surface 166 and the second median crack surface 167, and thus there is no second pressure crack surface 168 formed on the side wall 164. In particular, the roughness of the second cutting crack surface 166, the second median crack surface 167, and the second pressure crack surface 168 are different.

Figure 3A:
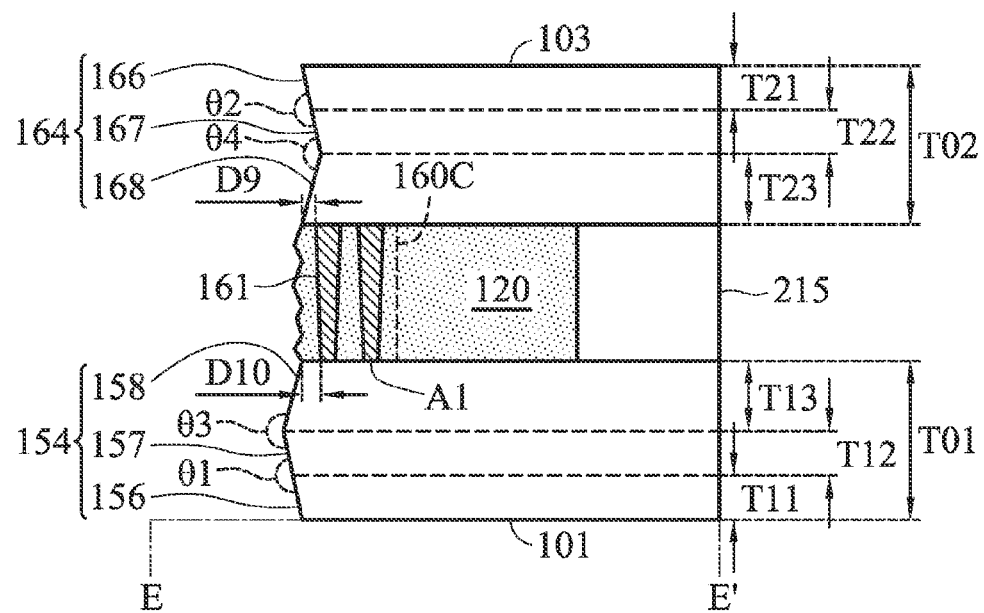
FIGS. 3A to 3D are cross-sectional views of the display devices of FIG. 1 along the line E-E'.

As shown in FIG. 3A, since the display device of the disclosure 100 has a stable cutting region 160 in order to increase support function during cutting process, the ratio of the sum of the thickness T11 of the first cutting crack surface 156 and the thickness T12 of the first median crack surface 157 to the thickness T01 of the side wall 154 of the first substrate 101 is from 0.3 to 1 (i.e. 0.3≤(T11+T12)/T01≤1), such as from 0.5 to 1, or from 0.7 to 1. Furthermore, the ratio of the sum of the thickness T21 of the second cutting crack surface 166 and the thickness T22 of the second median crack surface 167 to the thickness T02 of the side wall 164 of the second substrate 103 is from 0.3 to 1 (i.e. 0.3≤(T21+T22)/T02≤1), such as from 0.5 to 1, or from 0.7 to 1. As a result, the cutting and breaking performance of the display device can be improved, the substrate breakage rate can be reduced, and the yield of the display device can be increased. In addition, the first pressure crack surface 158 can have a thickness T13, and the second pressure crack surface 168 can have a thickness T23.

FIG. 3A is cross-sectional view of the display devices of FIG. 1 along the line E-E'. The first cutting crack surface 156 and the first median crack surface 157 define a first angle θ1, wherein the first angle θ1 can be greater than 90 degrees and less than 270 degrees; the second cutting crack surface 166 and the second median crack surface 167 define a second angle θ2, wherein the second angle θ2 can be greater than 90 degrees and less than 270 degrees; the first median crack surface 157 and the first pressure crack surface 158 define a third angle θ3, wherein the third angle θ3 can be greater than 90 degrees and less than 270 degrees; and, the second median crack surface 167 and the second pressure crack surface 168 define a fourth angle θ4, wherein the fourth angle θ4 can be greater than 90 degrees and less than 270 degrees.

As shown in FIG. 3A, a person skilled in the art would know that the first substrate 101 and the second substrate 103 can optionally have other elements, and a display medium layer 215, ex. a liquid-crystal layer, can be disposed between the first substrate 101 and the second substrate 103. For example, the first substrate 101 can be an array substrate, and the second substrate 103 can be a color filter substrate. In the stable cutting region 160 (such as the third stable region 160C), there is a distance D9 between at least one of the spacers 161 and the side wall 164 of the second substrate 103. Namely, the distance D9 is the minimum distance between the side wall 164 of the second substrate 103 and the spacers 161. The distance D9 is from 0 to 200 µm. There is a distance D10 between at least one of the spacers 161 and the side wall 154 of the first substrate 101. Namely, the distance D10 is the minimum distance between the side wall 154 of the first substrate 101 and the spacers 161. In particular, the distance D10 is greater than the distance D9.

Figure 3B:
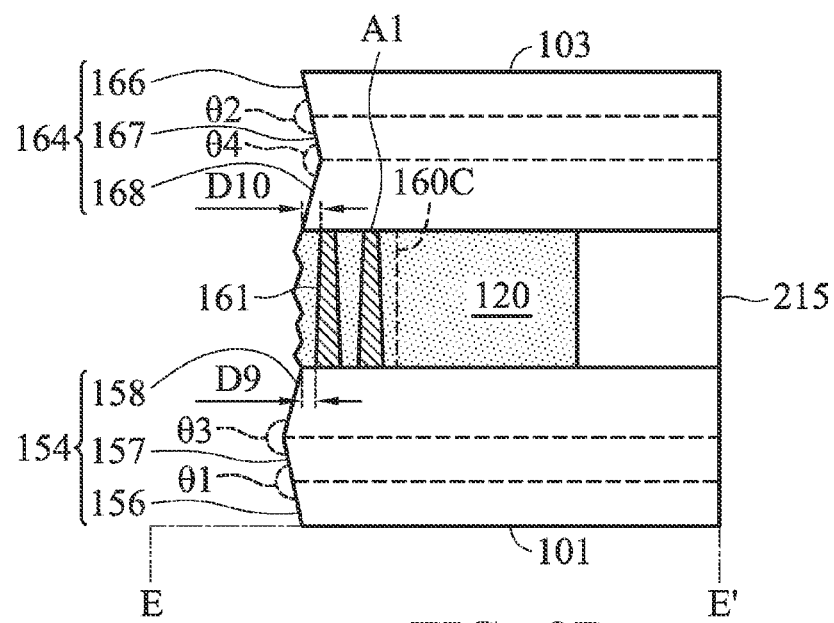
Figure 3C:
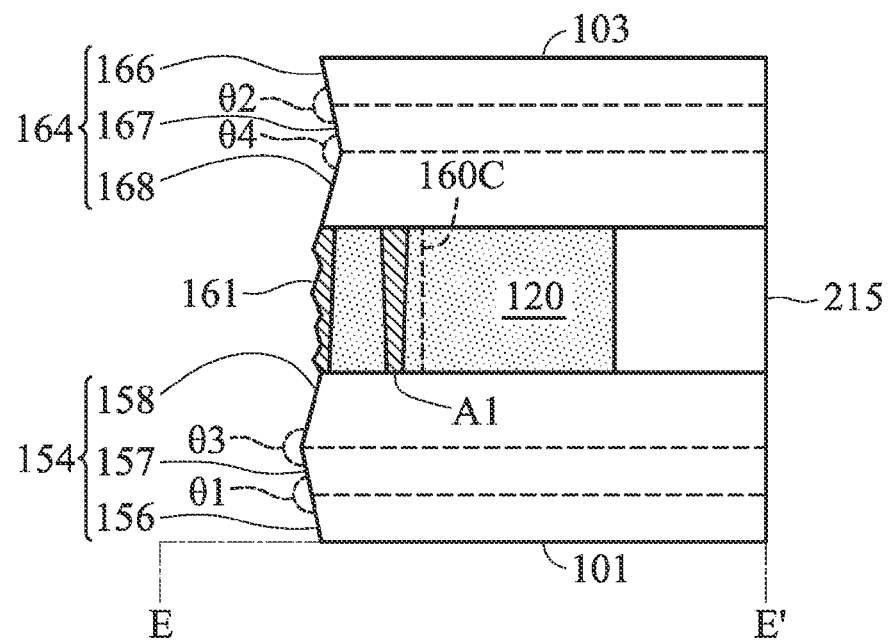
Figure 3D:
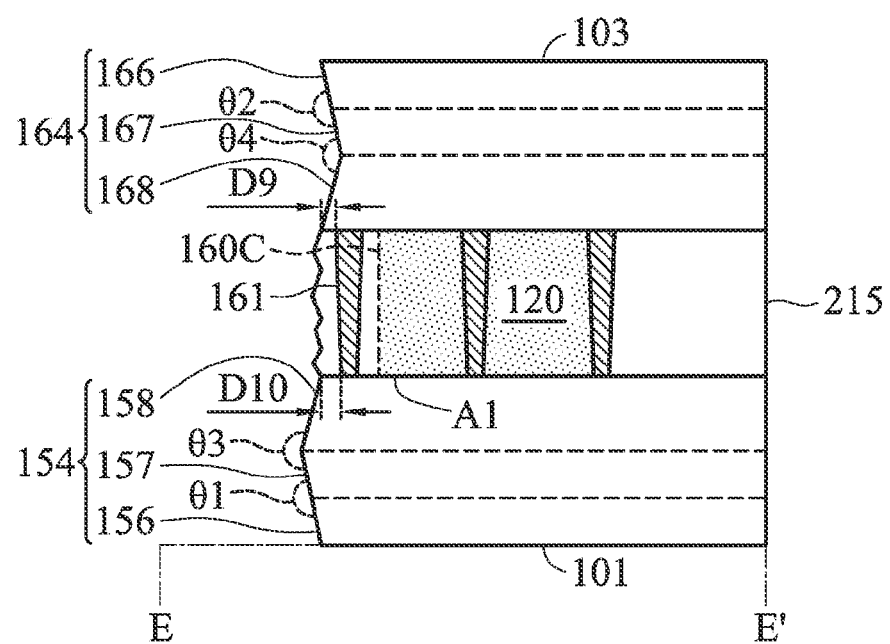

As shown in FIGS. 1 and 3A, the ratio between the area occupied by the spacers 161 and the stable cutting region is from 1% to 5%. Herein, the area occupied by the spacers 161 is the sum of a top surface area A1 of all the spacers 161. In an embodiment of the disclosure, the top surface of the spacer 161 is closer to the first substrate 101, in comparison with the second substrate 103. As shown in FIG. 3B, according to other embodiments of the disclosure, the spacer 161 can be disposed on the first substrate 101 (i.e. the top surface of the spacer 161 is closer to the second substrate 103, in comparison with the first substrate 101). According to embodiments of the disclosure, the plurality of spacers 161 can have the same or different top surface area A1. In addition, according to some embodiments of the disclosure, the spacer 161 within the stable cutting region 160 can be disposed across the predetermined cutting line resulting in remaining a part of the spacer 161 after cutting, as shown in FIG. 3C. According to other embodiments of the disclosure, the spacer 161 can be not overlapped by the sealant 120, as shown in FIG. 3D.

Figure 4:
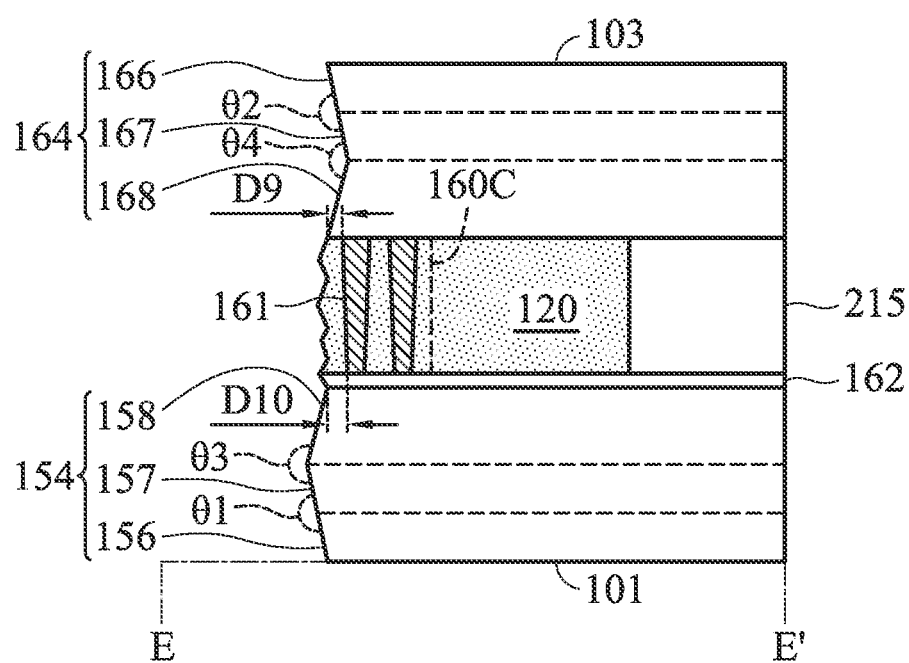
FIG. 4 is a cross-sectional view of the display device according to another embodiment of the disclosure along the line E-E' of FIG. 1.

As shown in FIG. 4, according to another embodiment of the disclosure, a planarization layer 162 can be disposed on the first substrate 101 and within the stable cutting region 160. The part of the stable cutting region 160, which is not occupied by the spacer 161 and the planarization layer 162, can be filled with the sealant 120. The plurality of spacers 161 can be disposed between the planarization layer 162 and the second substrate 103. According to some embodiments of the disclosure, the planarization layer 162 can be a patterned layer or have trenches. At least part of the sealant 120 is separated from the first substrate 101 by the planarization layer 162 (the planarization layer 162 is disposed between the first substrate 101 and the sealant 120), and at least part of the second substrate 103 is separated from the planarization layer 162 by the spacers 161 (the spacers 161 are disposed between the second substrate 103 and the planarization layer 162). The planarization layer 162 can be a layer with insulating properties, such as a dielectric material, or photosensitive resin.

Figure 5:
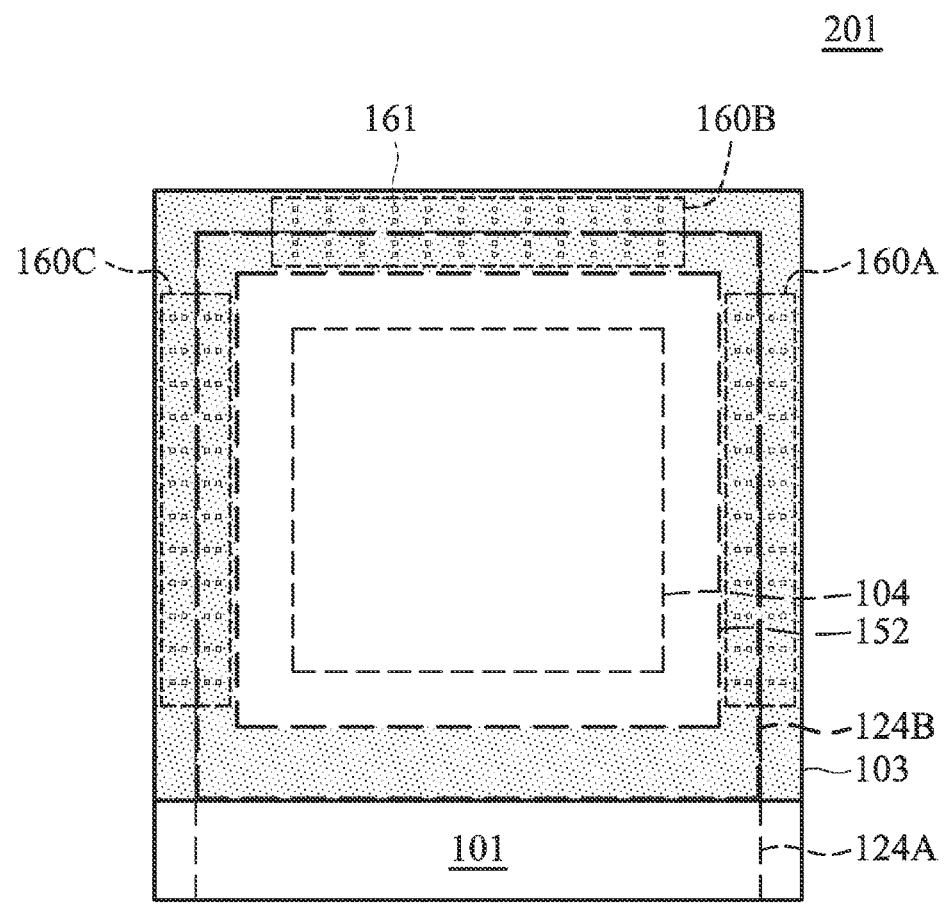
FIG. 5 is a top-view of a display device main substrate according to an embodiment of the disclosure, wherein the display device of FIG. 1 is obtained by cutting the display device main substrate of FIG. 5.

FIG. 5 is a top-view of a display device main substrate according to an embodiment of the disclosure, wherein the display device 100 of FIG. 1 can be obtained by cutting the display device main substrate of FIG. 5. The cutting process can be, for example, a single-tool cutting process, a multi-tool cutting process, or a laser cutting process.

As shown in FIG. 5, the stable cutting region 160 (including the first stable region 160A, the second stable region 160B, and the third stable region 160C) of the display device main substrate 201 is disposed along a predetermined cutting line 124A of the first substrate and a predetermined cutting line 124B of the second substrate. In an embodiment of the disclosure, the predetermined cutting line 124B of the second substrate constitutes a symmetrical axis for the stable cutting region 160 respectively. Namely, two parts of the stable cutting region 160 separated by the predetermined cutting line 124B of the second substrate have the same area and are substantially symmetrical. According to other embodiments of the disclosure, the predetermined cutting line 124B of the second substrate can constitute a non-symmetrical axis for the stable cutting region 160.

According to embodiments of the disclosure, the surface of the spacer 161 within the stable cutting region 160 in contact with the first substrate 101 (or the second substrate 103) can be circular, elliptical, square, rectangular, or a combination thereof. FIGS. 6A to 6F are close-up diagrams of the second stable region 160B of the display device main substrate of FIG. 5.

Figure 6A:
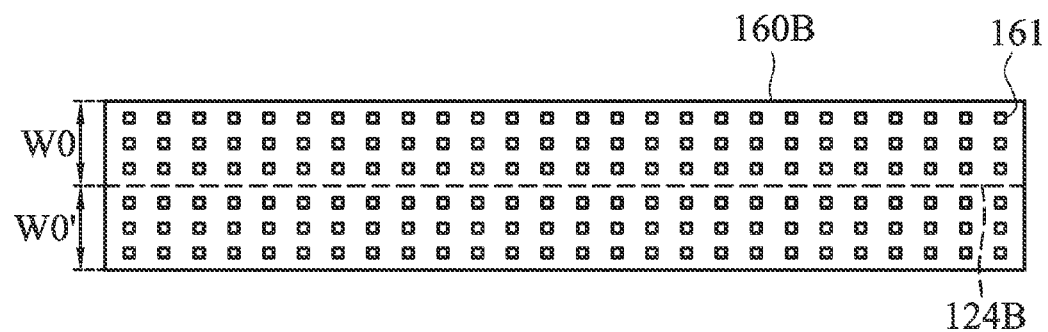
FIGS. 6A to 6F are close-up diagrams of the second stable region 160B of the display device main substrate of FIG. 5.
Figure 6B:
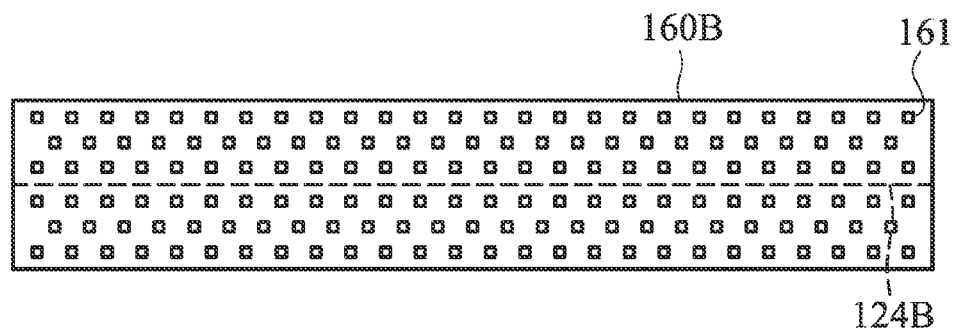
Figure 6C:
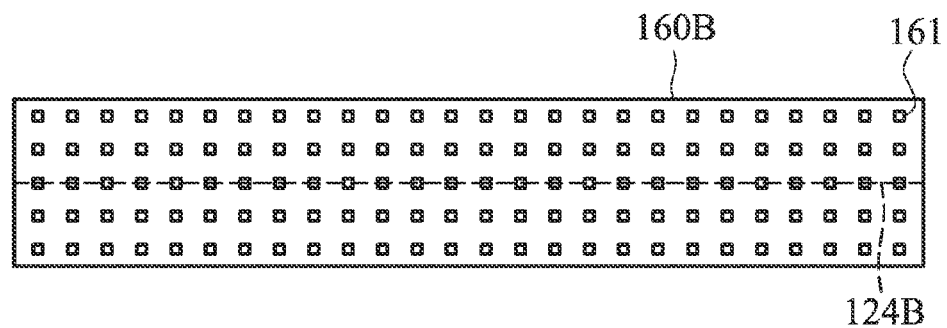

As shown in FIG. 6A, the plurality of spacers 161 can be disposed with the stable cutting region and set in parallel as an aligned array. In addition, the plurality of spacers 161 can be set in a staggered array, as shown in FIG. 6B. According to another embodiment of the disclosure, the predetermined cutting line 124B of the second substrate can pass through the spacers 161, as shown in FIG. 6C. Moreover, as shown in FIG. 6A, the width W0 between one side of the stable cutting region 160 (such as the second stable region 160B) and the predetermined cutting line 124B, and the width W0' between the opposite side of the stable cutting region 160 (such as the second stable region 160B) and the predetermined cutting line 124B are each from 50 μm to 150 μm.

Figure 6D:
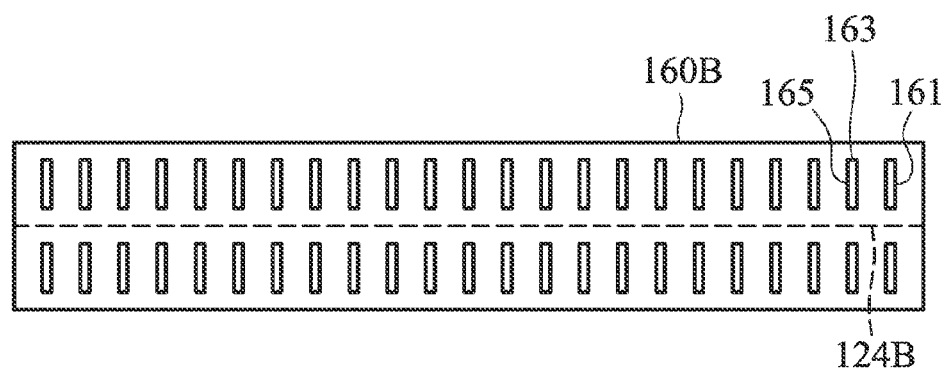
Figure 6E:
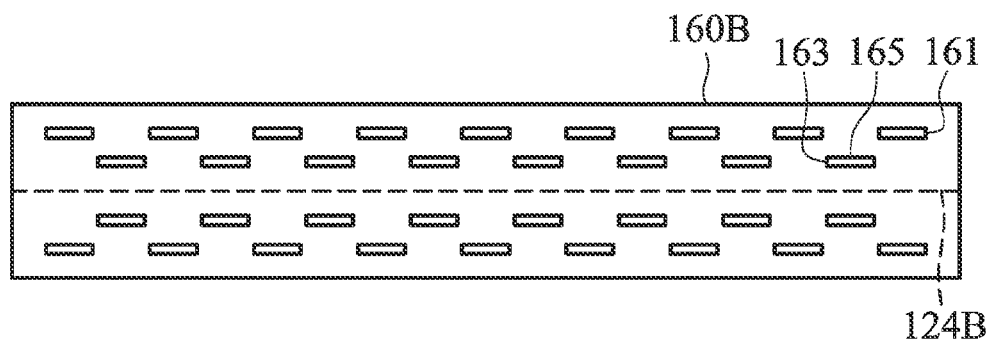
Figure 6F:
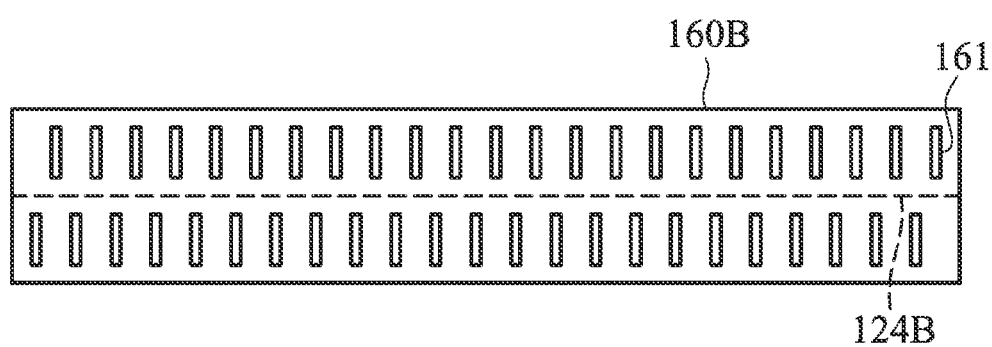

In addition, the surface of the spacer 161 within the stable cutting region 160 in contact with the first substrate 101 (or the second substrate 103) can be a rectangle and have a short edge 163 and a long edge 165. The long edge 165 can be substantially perpendicular to the predetermined cutting line 124B of the second substrate (as shown in FIG. 6D). On the other hand, the long edge 165 can also be parallel to the predetermined cutting line 124B of the second substrate (as shown in FIG. 6E). According to other embodiments of the disclosure, the spacers 161 can be substantially symmetrically disposed within the stable cutting region 160 with reference to the predetermined cutting line 124B of the second substrate. Furthermore, the spacers 161 can be non-symmetrically disposed with the stable cutting region 160, as shown in FIG. 6F. According to other embodiments of the disclosure, the first substrate 101 and the second substrate 103 may be not a rectangle, and the predetermined cutting lines can be modified according to the substrate and not limited to being parallel to or perpendicular to each other.

Figure 7:
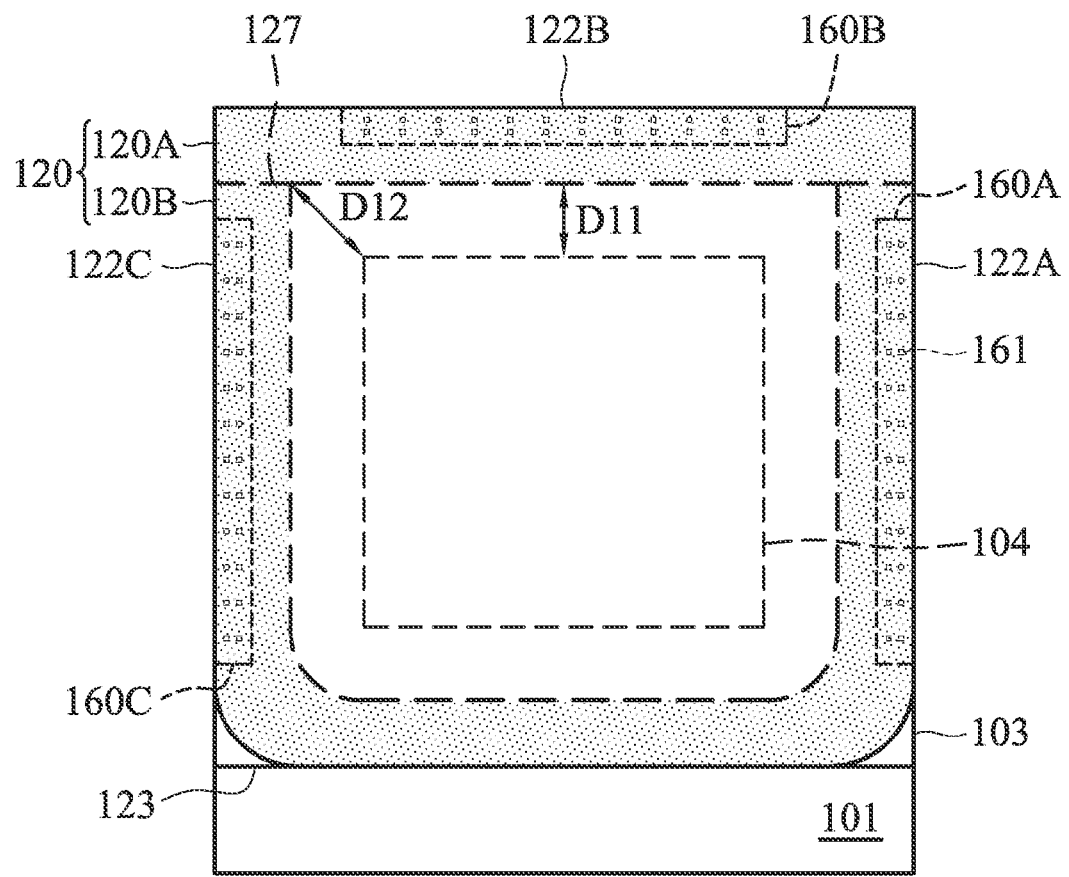
FIG. 7 is a top-view of a display device according to another embodiment of the disclosure.

As shown in FIG. 7, according to an embodiment of the disclosure, in order to narrow the frame of the display device, in addition to the widths of the non-display regions adjacent to the first boundary 122A and the third boundary 122C, the widths of the non-display regions adjacent to the second boundary 122B are also required to be reduced. Therefore, the sealant is closer to the display region. In order to prevent the sealant 120 from coming into contact with the display region 104 near the corner defined by the second boundary 122B and the third boundary 122C, the sealant 120 can be designed to consist of a linear portion 120A and an U-shaped portion 120B. The linear portion 120A is adjacent to the second boundary 122B, and the U-shaped portion 120B is adjacent to the first boundary 122A, the substrate border 123, and the third boundary 122C. Therefore, the distance D12 between the sealant 120 near the corner, which is defined by the second boundary 122B and the third boundary 122C, and the display region 104 is greater than the distance D11 between the sealant 120 adjacent to the second boundary 122B and the display region 104. Namely, the distance D11 is the minimum distance between the linear portion 120A and the display region 104, and the distance D12 is the minimum distance between the sealant border 127 (of the linear portion 120A and the U-shaped portion 120B) and the display region 104. In particular, the distance D12 is greater than or equal to the distance D11.

Figure 8:
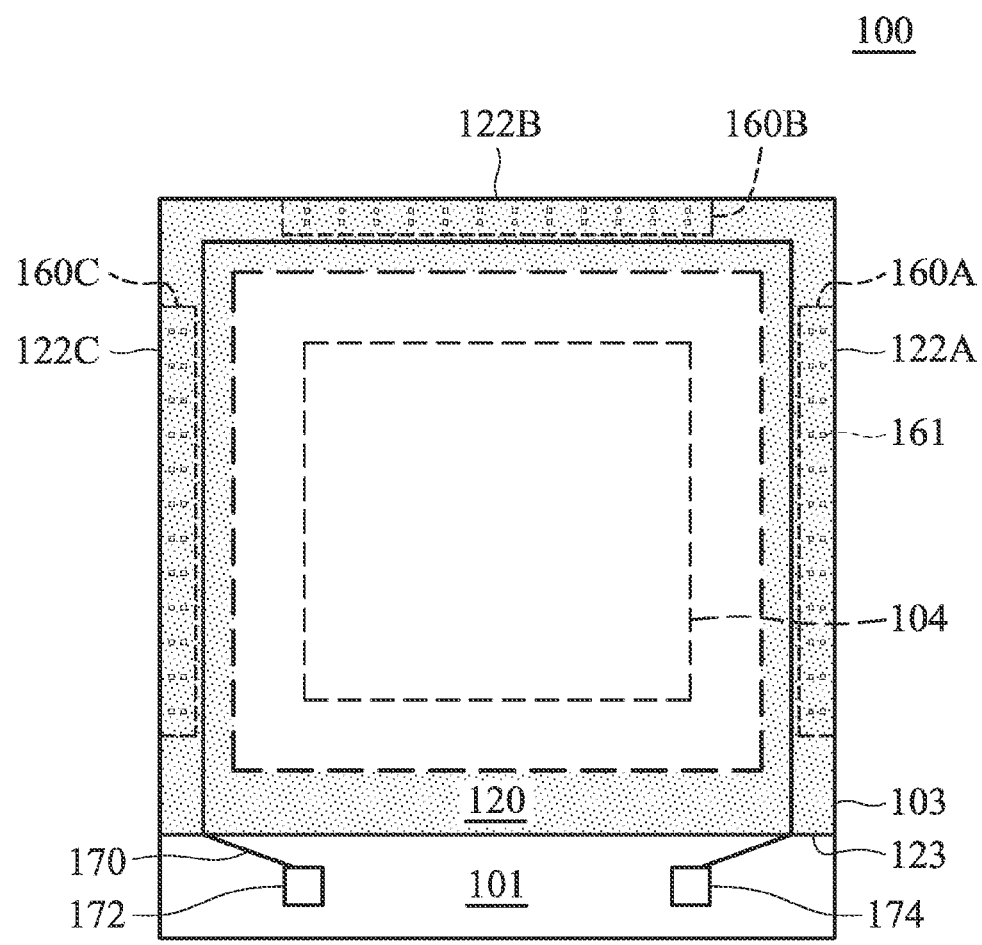
FIG. 8 is a top-view of a display device having a test circuit according to an embodiment of the disclosure.

On the other hand, the display device of the disclosure can further include a test circuit disposed outside the display region. as shown in FIG. 8, the display device 100 can include a first contacting pad 172 and a second contacting pad 174 disposed on the first substrate 101 and outside the display region 104. According to another embodiment, the display device 100 can further include a test circuit 170 substantially disposed along a part of edges of the first substrate, and the part of the edges of the first substrate substantially coincided with a part of edges of the second substrate. In the embodiment, the part of the edges of the first substrate comprises three edges which are the first boundary 122A, the second boundary 122B, and the third boundary 122C. The first contacting pad 172 electrically connects to the second contacting pad 174 via the test circuit 170. As shown in FIG. 8, the test circuit 170 is not disposed along the substrate border 123. As a result, after the cutting process for fabricating the display device 100, the voltage, resistance, or pulse waveform data between the first contacting pad 172 and the second contacting pad 174 can be measured and compared with a reference voltage, resistance, or pulse waveform data, in order to detect whether cutting shift is occurring on the display device.

For example, when cutting shift occurs during the cutting of the display device main substrate, the testing circuit can be damaged by the cutting process, since the test circuit is disposed along the three edges of the first substrate, and the three edges of the first substrate are substantially coincided with the three edges of the second substrate (i.e. the test circuit is disposed between the display region and the predetermined cutting line). Therefore, the resistance between the first contacting pad 172 and the second contacting pad 174 would be increased when the testing circuit is damaged in comparison with a reference resistance, and thus a cutting shift of the display device is detected.

Figure 9:
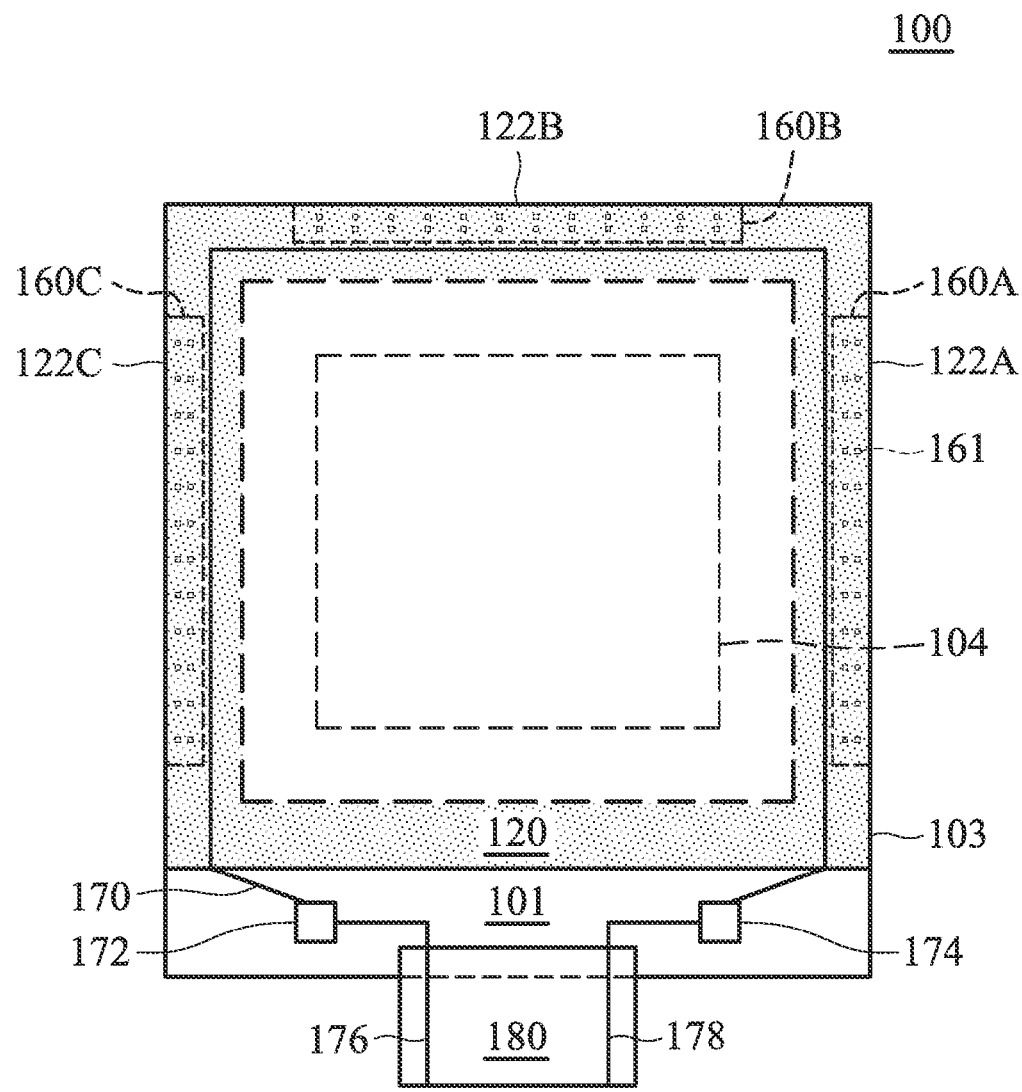
FIGS. 9 and 10 are top-views of display devices having a test circuit according to other embodiments of the disclosure.

Suitable materials for the test circuit 170, the first contacting pad 172, and the second contacting pad 174 including a single layer or multiple layers can be made of metal conductive material (such as aluminum (Al), copper (Cu), molybdenum (Mo), titanium (Ti), platinum (Pt), iridium (Ir), nickel (Ni), chromium (Cr), silver (Ag), gold (Au), tungsten (W), or an alloy thereof), metallic compound conductive material (such as: aluminum-containing compound, copper-containing compound, molybdenum-containing compound, titanium-containing compound, platinum-containing compound, iridium-containing compound, nickel-containing compound, chromium-containing compound, silver-containing compound, gold-containing compound, tungsten-containing compound, magnesium-containing compound, or a combination thereof), or a combination thereof. The material of the test circuit 170 and the material of the first contacting pad 172 (or the second contacting pad 174) can be the same or different. In addition, a passivation layer (not shown) can be formed on the test circuit 170, in order to prevent the test circuit 170 from coming into contact with and being deteriorated by the sealant 120. The passivation layer can be organic insulating materials (such as photosensitive resins) or inorganic insulating materials (such as silicon nitride, silicon oxide, silicon oxynitride, silicon carbide, aluminum oxide, or a combination thereof). as shown in FIG. 9, according to another embodiment of the disclosure, a circuit board 180 having a first circuit 176 and a second circuit 178 can be provided. Since the first circuit 176 and the second circuit 178 electrically connect to the first contacting pad 172 and the second contacting pad 174, respectively, a testing signal can be provided to the test circuit 170 via the first contacting pad 172 and the second contacting pad 174 in order to detect whether cutting shift is occurring on the display device. The circuit board 180 can be a flexible substrate, a rigid substrate, or a metal core PCB.

Figure 10:
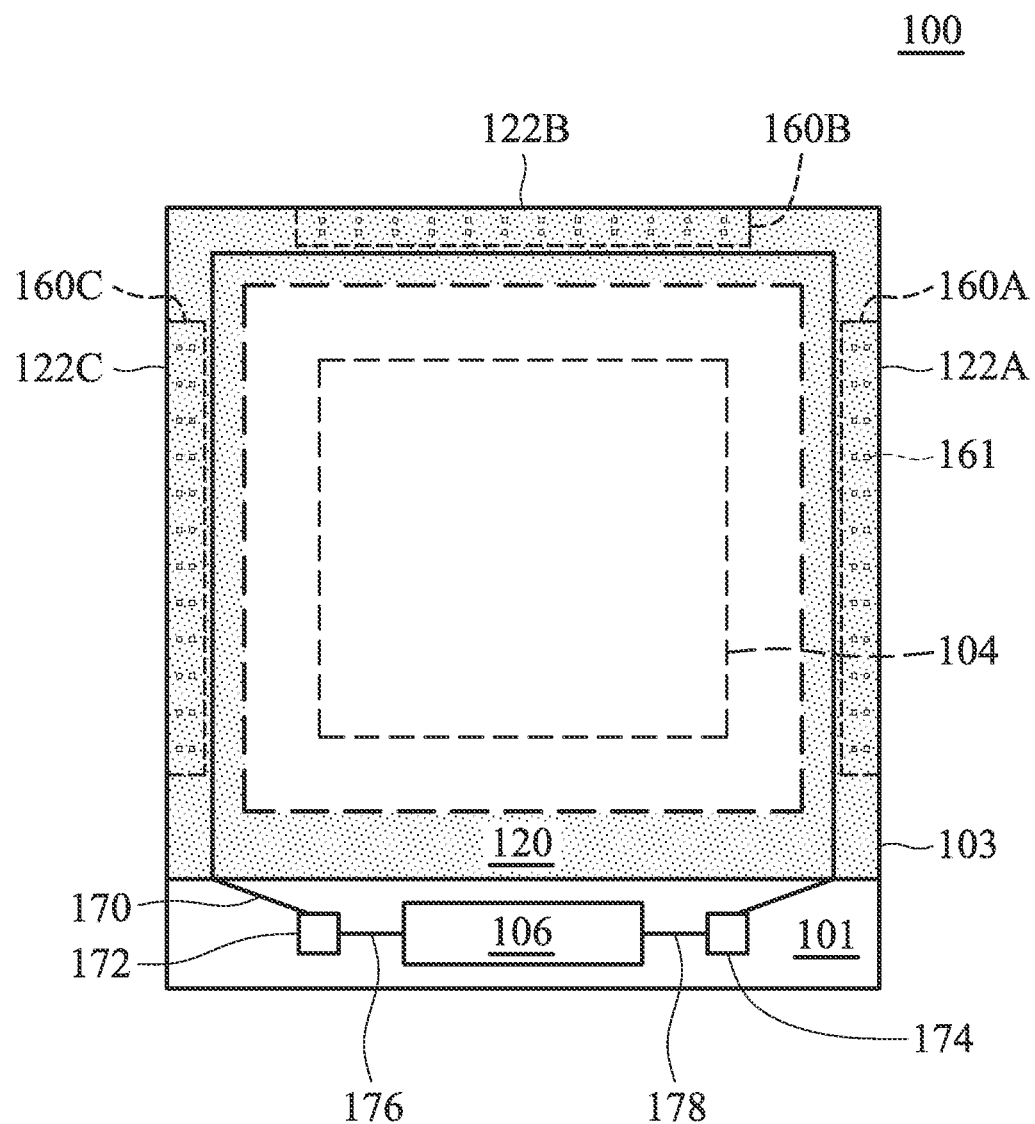

In addition, as shown in FIG. 10, according to other embodiments of the disclosure, a driving element 106 can be disposed on the first substrate 101 outside the display region 104. Since the driving element 106 can electrically connect to the first contacting pad 172 and the second contacting pad 174 via the first circuit 176 and the second circuit 178, a testing signal provided by the driving element 106 can be provided to the test circuit 170 via the first contacting pad 172 and the second contacting pad 174 in order to detect whether cutting shift is occurring on the display device. It should be noted that the testing signal can be a common electrode voltage signal, or a ground voltage signal. The driving element 106 can electrically connect to the display region 104 via a plurality of signal lines (not shown) to provide signals to the plurality of pixels (not shown) for displaying images. The driving element 106 can be an integrated circuit (IC).

According to embodiments of the disclosure, the display device has spacers disposed on the stable cutting region in order to increase the structural stability during a cutting process, improve the cutting and breaking performance, and reduce the substrate breakage rate. As a result, the yield of the display device can be improved. In addition, according to embodiments of the disclosure, the display device of the disclosure includes a test circuit disposed along predetermined cutting lines. Therefore, after the cutting process, the test circuit can be used to detect whether cutting shift is occurring on the display device.

First, a display device comprises a driving unit, a gate-driving circuit, a test pad and wires. The gate-driving circuit, a driving unit, the test pad and the wires are disposed on a substrate. The driving unit may be, but is not limited to, an integrated circuit (IC). The driving unit includes the gate-signal output bump. The gate-signal output bump is electrically connected to the gate-driving circuit through one wire and is electrically connected to the test pad through another wire. Accordingly, the two wires mentioned above occupy two regions of the driving unit (corresponding to region 113A and region 113B in FIG. 11B). When the amount of signal output contacts of the output bump increases as the resolution of the display panel is enhanced, not only the area used to accommodate the wire electrically connecting to the signal output contacts of the output bump would be insufficient, but also the portion of the substrate below the chip in which the wires pass through would be insufficient.

Figure 11A:
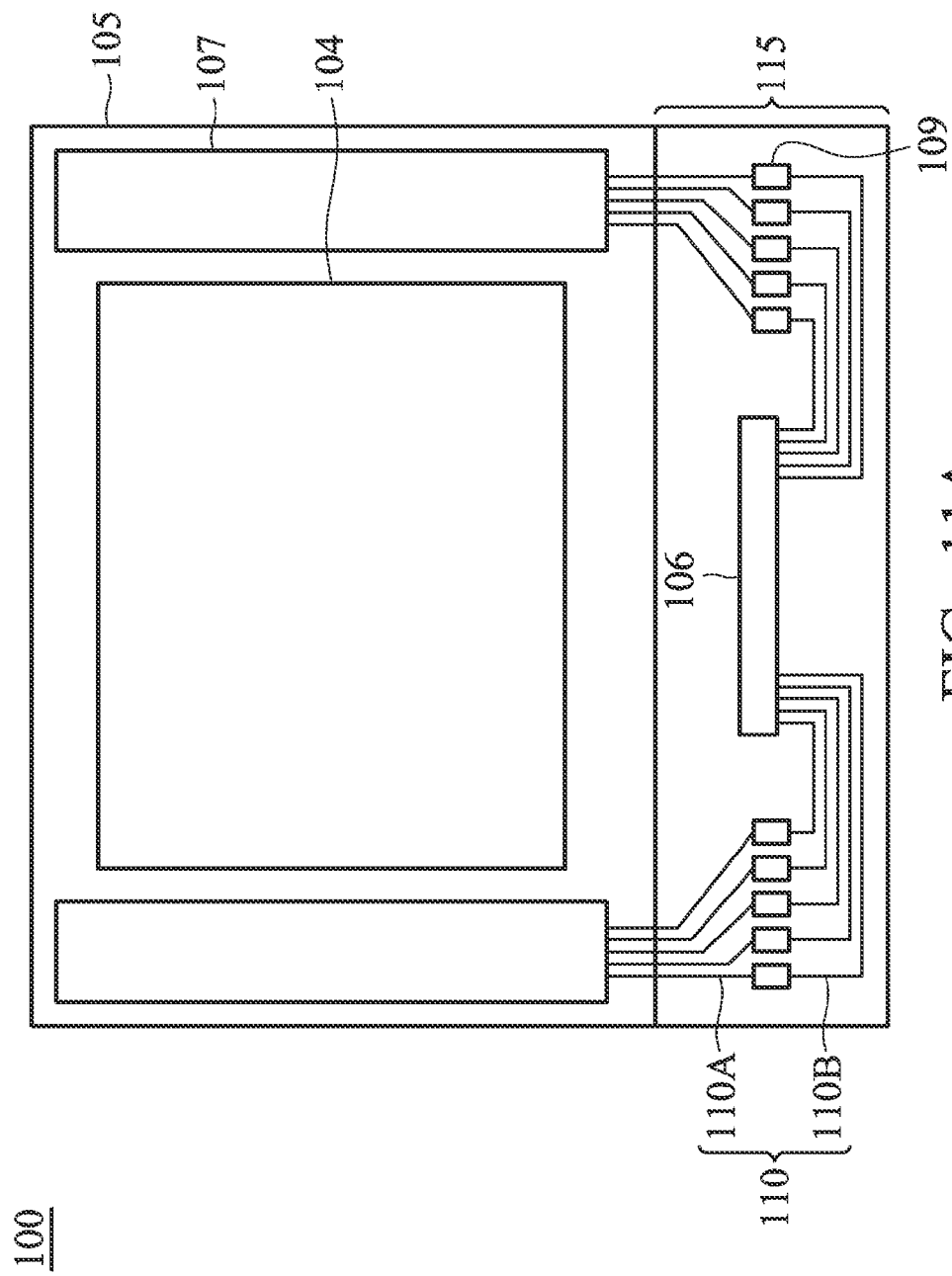
FIG. 11A is a top view of a display device in accordance with some embodiments of the present disclosure.

Therefore, in order to reduce the area occupied by the wire, another configuration of the wire in the display device is provided by the present disclosure. FIG. 11A is a top view of a display device in accordance with some embodiments of the present disclosure. As shown in FIG. 11A, the display device 100 includes a display region 104 and a non-display region 105 adjacent to the display region 104. The display region 104 is the region in the display device 100 in which the pixels including transistors display an image. The transistor may include, but is not limited to, an amorphous silicon thin film transistor or an LTPS thin film transistor. Therefore, the display region 104 is also referred to as a pixel-displaying region 104. The non-display region 105 is the region in the display device 100 other than the display region 104. In this embodiment, the non-display region 105 surrounds or encloses the display region 104. In addition, the non-display region 105 includes a gate-driving circuit (such as gate driver on panel, GOP) 107 disposed at the two opposite sides of the display region 104, a driving unit 106 and a test pad 109 disposed in the out lead bonding (OLB) region 115. In addition, the non-display region 105 further comprises a wire 110, and a portion of the wire 110 is disposed in the out lead bonding region 115. In other embodiments, the gate-driving circuit 107 may be disposed only at one side of the display region 104.

The display device 100 may include, but is not limited to, a liquid-crystal display, such as a thin film transistor liquid-crystal display. The driving unit 106 may provide a source signal to the pixels (not shown) in the display region 104 and/or provide a gate signal to the gate-driving circuit 107. The gate-driving circuit 107 may provide a scanning pulse signal to the pixels in the display region 104 and control the pixels (not shown) disposed in the display region 104 cooperating with the aforementioned source signal to display an image in the display device 100. The gate-driving circuit 107 may comprise, but is not limited to, a gate-on-panel (GOP) or any other suitable gate-driving circuit.

In addition, the driving unit 106 is electrically connected to the gate-driving circuit 107 through the test pad 109. The test pad 109 may be electrically connected to the gate-driving circuit 107 and the driving unit 106 by any suitable method. For example, in one embodiment, as shown in FIG. 11A, the test pad 109 is electrically connected to the gate-driving circuit 107 and the driving unit 106 through the wire 110.

Figure 11B:
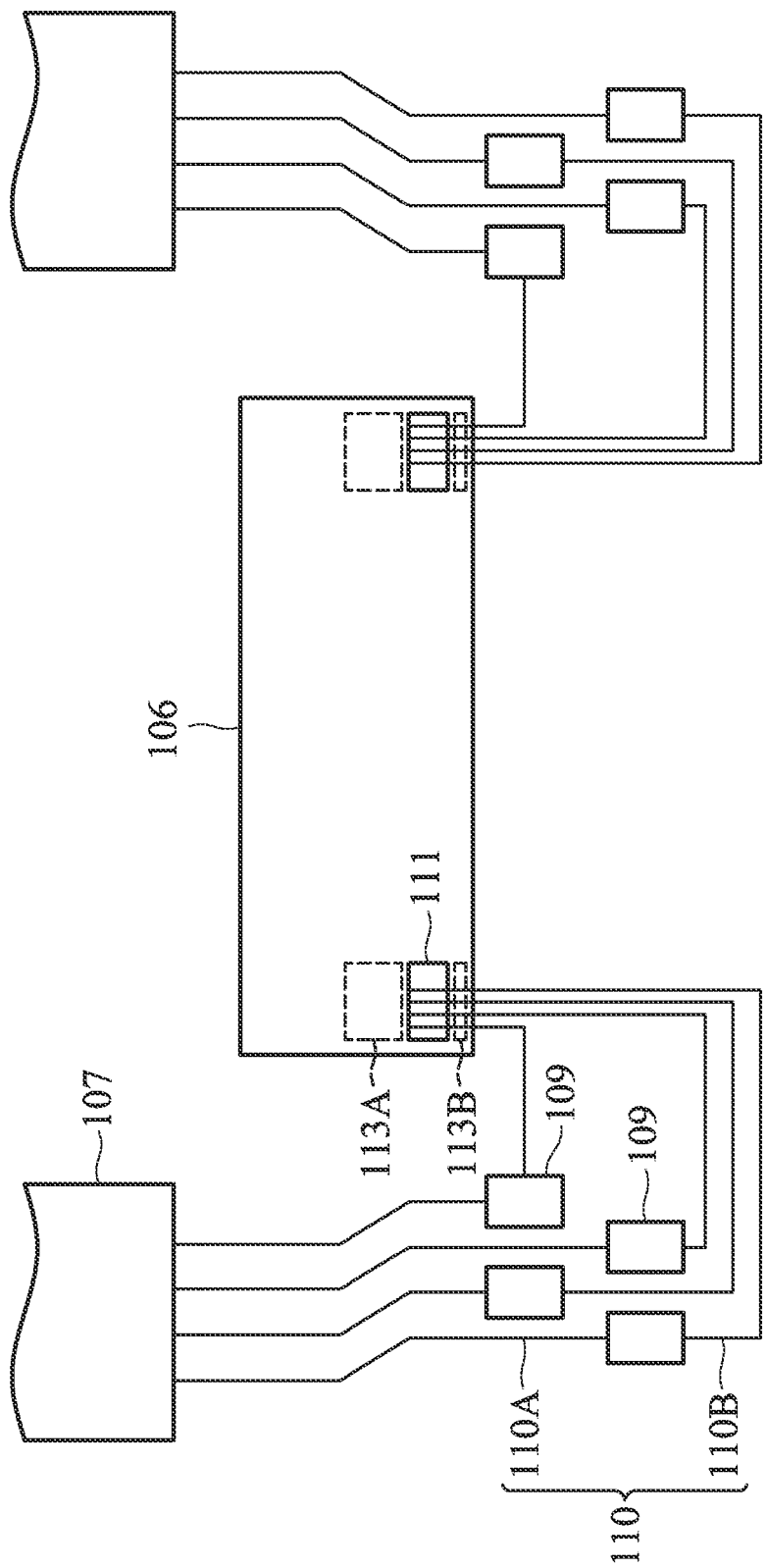
FIG. 11B is an enlarged figure of a portion of the display device in FIG. 11A.

By electrically connecting the driving unit 106 to the gate-driving circuit 107 through the test pad 109, the present disclosure may reduce the area occupied by the wire 110 in the driving unit 106, particular as illustrated in FIG. 11B, which is an enlarged figure of a portion of the display device 100 in FIG. 11A. As shown in FIG. 11B, the gate-signal output bump 111 of the driving unit 106 is electrically connected to the test pad 109 through the wire 110B. Then the test pad 109 is electrically connected to the gate-driving circuit 107 through another wire 110A. Compared to the aforementioned display device known to the applicant, the wires 110A and 110B in the known display device pass through the regions 113A and 113B respectively. Therefore, the area of the regions 113A and 113B must be occupied at the lower portion of the driving unit 106. However, the wire 110 of the present disclosure only occupies the area of the region 113B in the driving unit 106 and does not occupy the area of the region 113A. As the amount of signal output wire of the driving unit 106 increases when the resolution of the display panel is enhanced, the region 113A may be used to dispose another output wire. Therefore, the problem of there being insufficient area for the output wire in the chip such as the driving unit may be solved.

Furthermore, in order to improve the reliability and yield of the display device 100 in FIG. 11A, the test pad 109 of the display device 100 in the present disclosure may be a patterned test pad. In particular, in the testing step for testing the functionality of the display device 100, the test pad 109 must be touched by a probe, which would result in a hole in the conductive layer of the test pad 109 when the probe contacts the test pad 109. The hole in the conductive layer would be corroded and damaged by water and oxygen as time goes by, resulting in an open circuit or a malfunction of the wire between the driving unit 106 and the gate-driving circuit 107, which in turn would lower the reliability and yield of the display device 100. In order to solve the above technical problem, the test pad of the present disclosure may be patterned to be divided into a plurality of functional regions and sections which are apart from each other, and these functional regions and sections are electrically connected to each other through a connecting layer.

Figure 12:
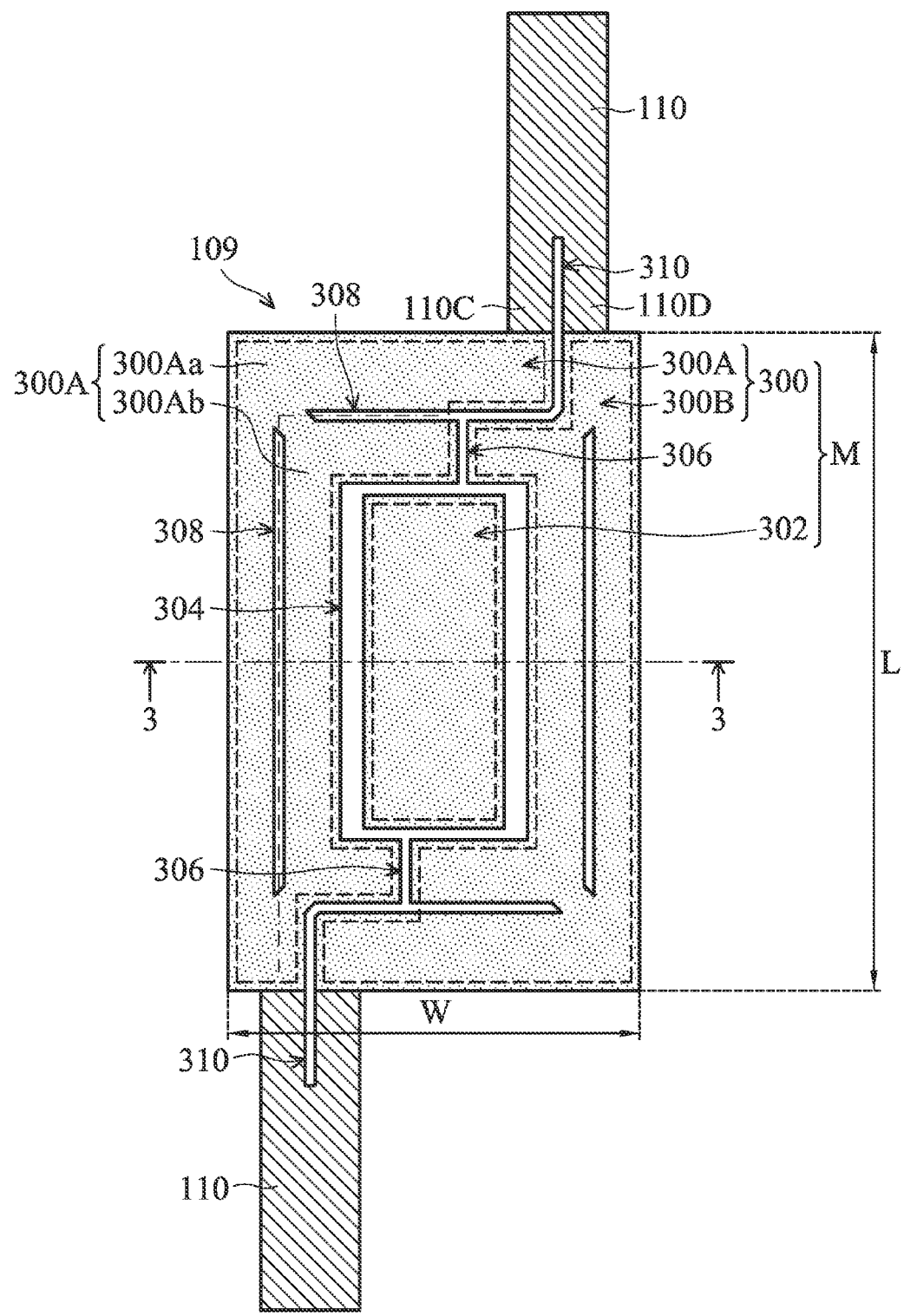
FIG. 12 is a top view of a test pad in accordance with some embodiments of the present disclosure.
Figure 13A:
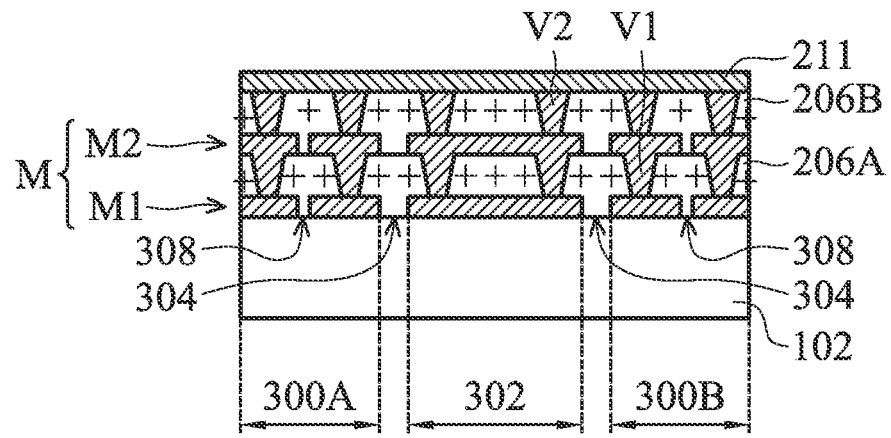
FIGS. 13A-13B are cross-sectional views of the test pad along line 3-3 in FIG. 12.

Referring to FIG. 12 and FIG. 3A, FIG. 12 is a top view of a test pad 109 in accordance with some embodiments of the present disclosure and FIG. 13A is a cross-sectional view of the test pad 109 along line 3-3 in FIG. 12. As shown in FIGS. 12 and 13A, the test pad 109 includes a conductive layer M disposed over a substrate 102, and the conductive layer M includes a first region 300 and a second region 302. The first region 300 of the conductive layer M is used to transmit the signal between two wires 110. The second region 302 of the conductive layer M is used to contact the probe in the testing step. The first region 300 of the conductive layer M directly contacts the wire 110, whereas the second region 302 of the conductive layer M is separated apart from the first region 300 of the conductive layer M. In other words, the first region 300 of the conductive layer M does not connect or contact the second region 302 of the conductive layer M. For example, the first region 300 of the conductive layer M is separated apart from the second region 302 of the conductive layer M by a main gap 304. In addition, the second region 302 of the conductive layer M is separated apart from the wire 110. In other words, the second region 302 of the conductive layer M does not connect or contact the first region 300 of the conductive layer M and the wire 110. The first region 300 is electrically connected to the second region 302 by another connecting layer through a contact via.

Since the second region 302 of the conductive layer M, which is used to contact the probe in the testing step, is separated apart from the first region 300 of the conductive layer M, which is used to transmit the signal, and the wire 110, the corrosion after the testing step is limited to the second region 302 of the conductive layer M. Therefore, the first region 300 of the conductive layer M and the wire 110 would not be corroded. Accordingly, even if the corrosion happens after the testing step, the patterned test pad 109 of the present disclosure may still transmit signals through the first region 300 of the conductive layer M and the wire 110. Therefore, the patterned test pad 109 may improve the reliability and yield of the display device 100.

In addition, the ratio of the area of the first region 300 to that of the second region 302 of the conductive layer M ranges from about 2 to 1000, for example from about 4 to 10. If the area ratio of the first region 300 to the second region 302 is too large, for example greater than 1000, the area of the second region 302 of the conductive layer M which is used to contact the probe would be too small, such that it would be difficult to perform the testing step. However, if the area ratio of the first region 300 to the second region 302 is too small, for example smaller than 2, the area of the first region 300 of the conductive layer M which is used to transmit the signal would be too small, which in turn increases the resistance. In addition, the size of the test pad 109 may range from about 100 μm to 1000 μm, for example from about 500 μm to 800 μm. The size of the test pad 109 refers to the length L or width W of the test pad 109.

Referring to FIG. 13A, the conductive layer M is disposed over the substrate 102. The conductive layer M may comprise, but is not limited to, a metal layer. The material of the metal layer may include, but is not limited to, a single layer or multiple layers of copper, aluminum, tungsten, gold, chromium, nickel, platinum, titanium, iridium, rhodium, a combination thereof, an alloy thereof, or other metal materials with good conductivity. In other embodiments, the conductive layer M includes a nonmetal material. The conductive layer M may include any conductive material and would suffer a corrosion expansion after being corroded, and the conductive material could be used as the conductive layer M of the embodiments mentioned above. For example, in the embodiment shown in FIG. 13A, the conductive layer M is a double-layer conductive layer, which includes the first conductive layer M1 and the second conductive layer M2. In one embodiment, the materials of the first conductive layer M1 and the second conductive layer M2 are the same. However, in other embodiments, the materials of the first conductive layer M1 and the second conductive layer M2 may be different. An interlayer dielectric (ILD) layer 206A is disposed between the first conductive layer M1 and the second conductive layer M2. The first conductive layer M1 and the second conductive layer M2 have the same pattern, and the corresponding patterns are electrically connected to each other through the via V1 in the interlayer dielectric layer 206A. The material of the interlayer dielectric layer 206A may include, but is not limited to, silicon oxide, silicon nitride, silicon oxynitride, boron phosphorus silicate glass (BPSG), phosphorus silicate glass (PSG), spin-on glass (SOG), or any other suitable dielectric material, or a combination thereof. The material which electrically connects the first conductive layer M1 and the second conductive layer M2 through the via V1 may include, but is not limited to, the material of the first conductive layer M1, the material of the second conductive layer M2, a combination thereof, copper, aluminum, tungsten, doped poly-silicon, or any other suitable conductive material, or a combination thereof.

In addition, in the embodiment shown in FIG. 13A, the first region 300 of the conductive layer M may be electrically connected to the second region 302 of the conductive layer M by a connecting layer 211. Since the connecting layer 211 has a higher anticorrosive ability than the conductive layer, and the first region 300 and the second region 302 are electrically connected by a connecting layer 211 rather than by direct contact, the connecting layer 211 would protect the conductive layer from being corroded by water and oxygen. The material of the connecting layer 211 may include, but is not limited to, transparent conductive material such as indium tin oxide (ITO), tin oxide (TO), indium zinc oxide (IZO), indium gallium zinc oxide (IGZO), indium tin zinc oxide (ITZO), antimony tin oxide (ATO), antimony zinc oxide (AZO), a combination thereof, or any other suitable transparent conductive oxide with higher anticorrosive ability. The connecting layer 211 may be electrically connected to the conductive layer M1 or the conductive layer M2 by the via V2 in the interlayer dielectric layer 206B to electrically connect the first region 300 of the conductive layer M and the second region 302 of the conductive layer M.

Figure 13B:
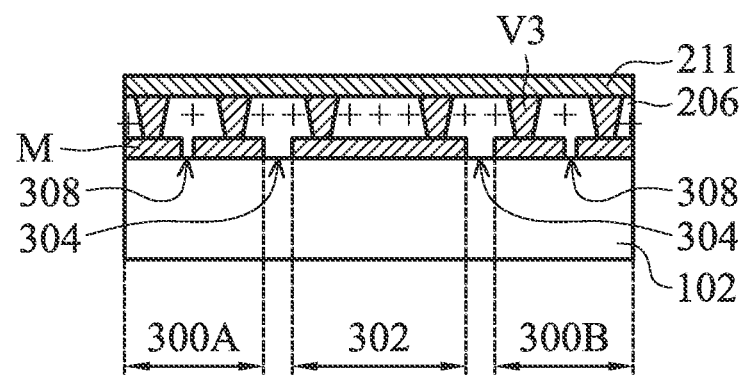

In addition, the conductive layer M may also be a single-layer conductive layer. As shown in FIG. 13B, only one single conductive layer M is disposed over the substrate 102, and the first region 300 of the conductive layer M may be electrically connected to the second region 302 of the conductive layer M by the connecting layer 211 through the via. For example, the connecting layer 211 may be electrically connected to the conductive layer M by the via V3 in the interlayer dielectric layer 206 to electrically connect the first region 300 of the conductive layer M to the second region 302 of the conductive layer M.

Referring to FIG. 12, in the embodiment shown in FIG. 12, the main gap 304 may surround the second region 302 of the conductive layer M. The width of the main gap 304 may range from about 10 µm to 100 µm, for example from about 20 µm to 40 µm. Alternatively, the ratio of the width of the main gap 304 to the width W of the test pad 109 may range from about 0.01 to 0.25, for example from about 0.025 to 0.1. If the width of the main gap 304 is too large, for example if the width of the main gap 304 is larger than 100 µm or the ratio of the width of the main gap 304 to the width W of the test pad 109 is larger than 0.25, the main gap 304 would occupy too much area of the test pad 109, which in turn reduces the area of the conductive layer M and increases the resistance. However, if the width of the main gap 304 is too small, for example if the width of the main gap 304 is smaller than 10 µm or the ratio of the width of the main gap 304 to the width W of the test pad 109 is smaller than 0.01, the main gap 304 could not effectively prevent the first region 300 of the conductive layer M from being corroded. For example, when the width of the main gap 304 is too small, if the probe contacts the main gap 304 due to shifting, the first region 300 of the conductive layer M would probably be exposed such that the first region 300 of the conductive layer M would be corroded.

In addition, the first region 300 of the conductive layer M also surrounds or encloses the second region 302 of the conductive layer M. The first region 300 of the conductive layer M may be divided into a plurality of sections which are separated apart from each other by one or more first gaps 306. In other words, the plurality of sections such as the sections 300A and 300B shown in FIG. 12 do not contact each other. The plurality of sections 300A and 300B which are apart from each other may further improve the reliability and yield of the display device 100. In particular, in the testing step, the probe may contact the first region 300 of the conductive layer M due to shifting. Therefore, the first region 300 of the conductive layer M may also be corroded after the testing step. The plurality of sections 300A and 300B which are separated apart from each other may limit the corrosion in the section touched by the probe, and the signal may still be transmitted by other sections of the first region 300 of the conductive layer M which are not corroded. For example, if the probe contacts section 300A, since sections 300A and 300B are separated apart from each other, the corrosion is limited to section 300A, and the signal can still be transmitted by section 300B, which is not corroded. Therefore, dividing the first region 300 of the conductive layer M into a plurality of sections which are separated apart from each other by one or more first gaps 306 may further improve the reliability and yield of the display device 100.

The width of the first gap 306 may range from about 3 µm to 50 µm, for example from about 10 µm to 20 µm. Alternatively, the ratio of the width of the first gap 306 to the width W of the test pad 109 may range from about 0.0033 to 0.1, for example from about 0.01 to 0.02. If the width of the first gap 306 is too large, for example if the width of the first gap 306 is larger than 50 µm or the ratio of the width of the first gap 306 to the width W of the test pad 109 is larger than 0.1, the first gap 306 would occupy too much area of the test pad 109, which in turn reduces the area of the conductive layer M and increases the resistance. However, if the width of the first gap 306 is too small, for example if the width of the first gap 306 is smaller than 3 µm or the ratio of the width of the first gap 306 to the width W of the test pad 109 is smaller than 0.0033, the first gap 306 cannot effectively separate the sections 300A and 300B.

In addition, the plurality of sections 300A and 300B in the first region 300, which are apart from each other, may further include one or more in-section gaps 308. The in-section gaps 308 may divide the sections 300A and 300B into a plurality of sub-sections. The sub-sections are substantially apart from each other, and the sub-sections connect to each other only by a small part or a small portion of the sub-sections. For example, section 300A may be divided into a plurality of sub-sections 300Aa and 300Ab by a plurality of in-section gaps 308. The sub-sections 300Aa and 300Ab are substantially apart from each other, and the sub-sections 300Aa and 300Ab physically connect to each other only by a small part or a small portion located at the upper left and lower left in the figure. The plurality of the sub-sections 300Aa and 300Ab which are substantially apart from each other may further improve the reliability and yield of the display device 100. For example, if the probe contacts the sub-section 300Ab, since sub-sections 300Aa and 300Ab connect to each other only by a small part or a small portion, the corrosion is limited to sub-section 300Ab. Even if sub-section 300Ab is damaged due to corrosion, the signal may still be transmitted by sub-section 300Aa, which is not corroded. Therefore, dividing the plurality of sections 300A and 300B into a plurality of sub-sections such as sub-sections 300Aa and 300Ab by the in-section gaps 308 may further improve the reliability and yield of the display device 100.

The width of the in-section gap 308 may range from about 3 µm to 50 µm, for example from about 10 µm to 20 µm. Alternatively, the ratio of the width of the in-section gap 308 to the width W of the test pad 109 may range from about 0.0033 to 0.1, for example from about 0.01 to 0.02. If the width of the in-section gap 308 is too large, for example if the width of the in-section gap 308 is larger than 50 µm or the ratio of the width of the in-section gap 308 to the width W of the test pad 109 is larger than 0.1, the in-section gap 308 would occupy too much area of the test pad 109, which in turn reduces the area of the conductive layer M and increases the resistance. However, if the width of the in-section gap 308 is too small, for example if the width of the in-section gap 308 is smaller than 3 μm or the ratio of the width of the in-section gap 308 to the width W of the test pad 109 is smaller than 0.0033, sub-sections 300Aa and 300Ab would be too close, and the in-section gap 308 could not effectively prevent corrosion.

Referring to FIG. 12, the material of the wire 110 may include, but is not limited to, a single layer or multiple layers of copper, aluminum, tungsten, gold, chromium, nickel, platinum, titanium, iridium, rhodium, a combination thereof, an alloy thereof, or other metal materials with good conductivity. In addition, the wire 110 may further include one or more in-wire gaps 310. In one embodiment, at least one in-wire gap 310 connects to at least one first gap 306. The in-wire gap 310 may further improve the reliability and yield of the display device 100. In particular, if the corrosion extends from the sections 300A,300B of the first region 300 to the first-section wire 110C, the in-wire gap 310 may limit the corrosion to the first-section wire 110C, and the second-section wire 110D would not be corroded. Accordingly, since the wire 110 would not be corroded completely, the in-wire gap 310 may further improve the reliability and yield of the display device 100. In other embodiments, the connecting layer 211 may also be disposed above or overlapped the wire 110.

The width of the in-wire gap 310 may range from about 3 μm to 50 μm, for example from about 10 μm to 20 μm. Alternatively, the ratio of the width of the in-wire gap 310 to the width of the wire 110 may range from about 0.02 to 0.5, for example from about 0.05 to 0.2. If the width of the in-wire gap 310 is too large, for example if the width of the in-wire gap 310 is larger than 50 μm or the ratio of the width of the in-wire gap 310 to the width of the wire 110 is larger than 0.5, the risk of an open circuit occurring in the wire 110 would increase due to the overly large size of the in-wire gap 310. However, if the width of the in-wire gap 310 is too small, for example if the width of the in-wire gap 310 is smaller than 3 μm or the ratio of the width of the in-wire gap 310 to the width of the wire 110 is smaller than 0.02, the in-wire gap 310 would not effectively prevent the corrosion from extending between the first-section wire 110C and the second-section wire 110D at the opposite sides of the in-wire gap 310. Alternatively, the ratio of the length of the in-wire gap 310 to the length L of the test pad 109 may range from about 0.03 to 3. The length of the in-wire gap 310 may be as short as 3 μm. Alternatively, the ratio of the length of the in-wire gap 310 to the length L of the test pad 109 may be as small as 0.03. The length of the in-wire gap 310 may be as long as the length of the wire 110 in the out lead bonding region 115. If the length of the in-wire gap 310 is too short, for example if the length of the in-wire gap 310 being shorter than 3 μm or the ratio of the length of the in-wire gap 310 to the length L of the test pad 109 is smaller than 0.03, the in-wire gap 310 could not effectively separate the first-section wire 110C and the second-section wire 110D. However, the length of the in-wire gap 310 cannot be longer than the length of the wire 110 in the out lead bonding region 115.

It should be noted that the exemplary embodiment set forth in FIG. 12 is merely for the purpose of illustration. In addition to the embodiment set forth in FIG. 12, the test pad could have other patterns as shown in FIGS. 14-17. The inventive concept and scope are not limited to the exemplary embodiment shown in FIG. 12.

Figure 14:
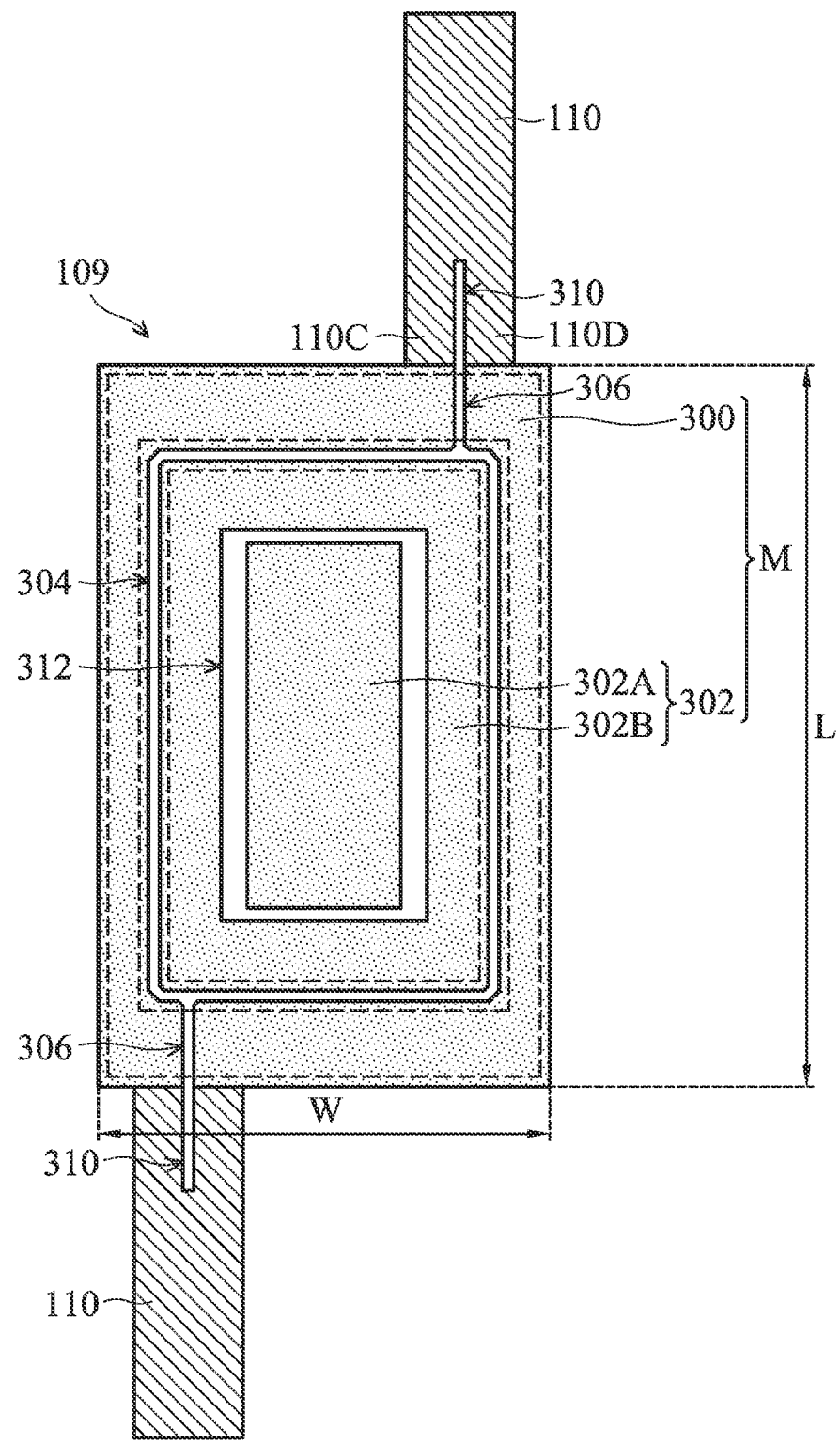
FIG. 14 is a top view of a test pad in accordance with another embodiment of the present disclosure.

Referring to FIG. 14, which is a top view of a test pad in accordance with another embodiment of the present disclosure. The difference between the embodiments shown in FIGS. 12 and 14 is that the second region 302 of the conductive layer M is also divided into a plurality of sections 302A and 302B which are separated from each other by one or more second gaps 312. In other words, the plurality of sections 302A and 302B do not directly contact each other. In addition, in the embodiment shown in FIG. 14, the first region 300 of the conductive layer M does not include an in-section gap.

The plurality of sections 302A and 302B which are apart from each other may further improve the reliability and yield of the display device 100. For example, when the probe touches section 302A, the corrosion is limited to section 302A, and section 302B, which is not corroded, could still transmit signals through the via and the connecting layer. Therefore, the plurality of sections 302A and 302B may further improve the reliability and yield of the display device 100 and may further reduce the resistance.

The width of the second gap 312 may range from about 10 μm to 100 μm, for example from about 30 μm to 50 μm. Alternatively, the ratio of the width of the second gap 312 to the width W of the test pad 109 may range from about 0.01 to 0.25, for example from about 0.05 to 0.1. If the width of the second gap 312 is too large, for example if the width of the second gap 312 is larger than 100 μm or the ratio of the width of the second gap 312 to the width W of the test pad 109 is larger than 0.25, the second gap 312 would occupy too much area of the test pad 109, which in turn reduces the area of the conductive layer M and increases the resistance. However, if the width of the second gap 312 is too small, for example if the width of the second gap 312 is smaller than 10 μm or the ratio of the width of the second gap 312 to the width W of the test pad 109 is smaller than 0.01, the second gap 312 could not effectively separate the sections 302A and 302B.

Figure 15:
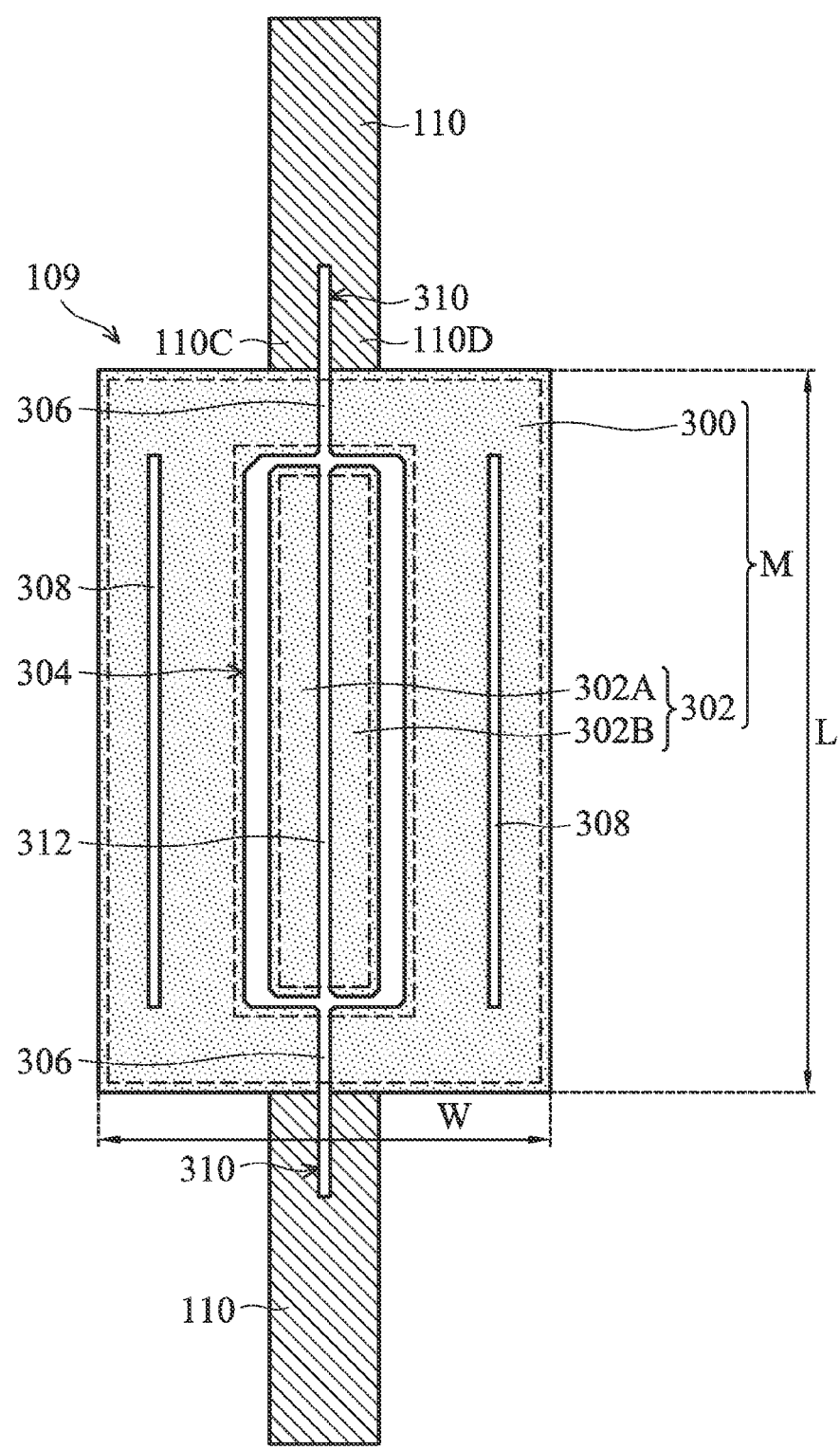
FIG. 15 is a top view of a test pad in accordance with another embodiment of the present disclosure.

Referring to FIG. 15, which is a top view of a test pad in accordance with another embodiment of the present disclosure. In the embodiment shown in FIG. 5, the second region 302 of the conductive layer M is also divided into a plurality of sections 302A and 302B which are separated apart from each other by one or more second gaps 312. The difference between the embodiment shown in FIG. 5 and the embodiment shown in FIG. 4 is that the second gap 312 of this embodiment is aligned with the first gap 306 and the in-wire gap 310.

Figure 16:
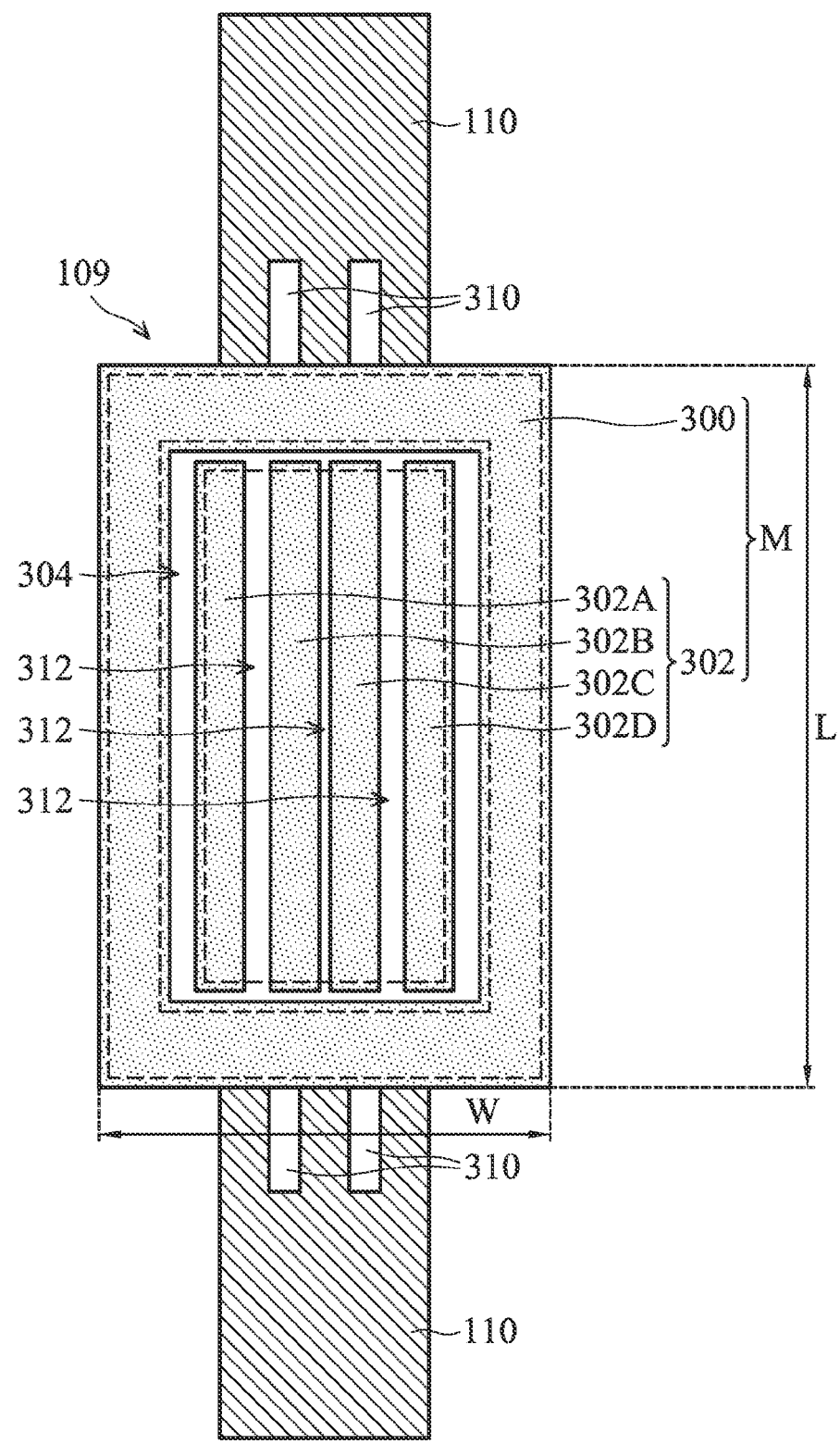
FIG. 16 is a top view of a test pad in accordance with another embodiment of the present disclosure.

Referring to FIG. 16, which is a top view of a test pad in accordance with another embodiment of the present disclosure. The difference between the embodiment shown in FIG. 16 and the embodiment shown in FIG. 15 is that the second region 302 of the conductive layer M is divided into four sections 302A, 302B, 302C and 302D which are separated apart from each other by three second gaps 312. In addition, the wire 110 includes two in-wire gaps 310, and the first region 300 of the conductive layer M does not include the first gap.

Figure 17:
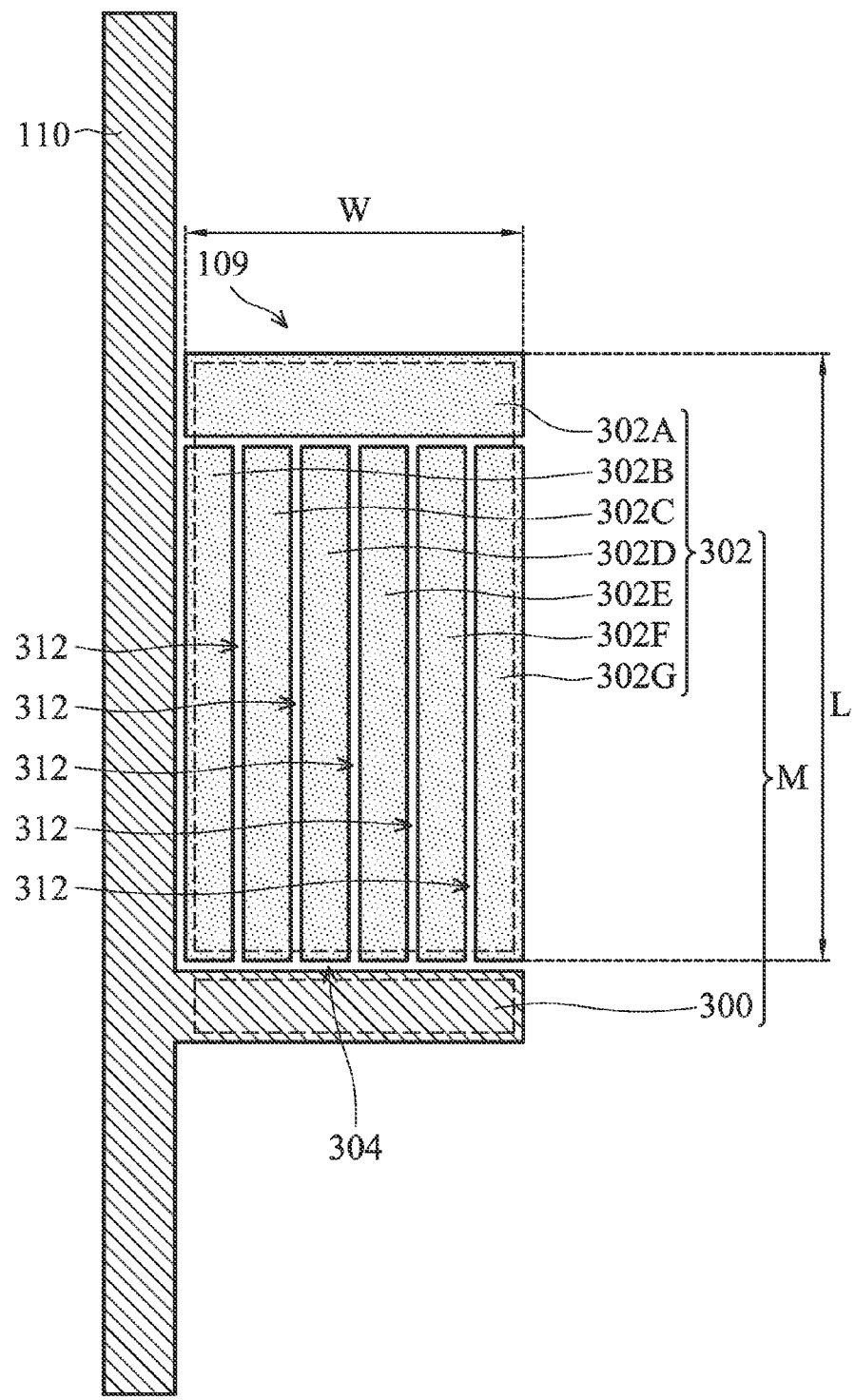
FIG. 17 is a top view of a test pad in accordance with another embodiment of the present disclosure.

Referring to FIG. 17, which is a top view of a test pad in accordance with another embodiment of the present disclosure. The difference between the embodiment shown in FIG. 17 and the embodiments shown in FIGS. 12 and 14-16 is that the first region 300 of the conductive layer M does not surround or enclose the second region 302 of the conductive layer M. Instead, the first region 300 of the conductive layer M is disposed at one side of the second region 302 of the conductive layer M. In addition, the second region 302 of the conductive layer M is divided into seven sections 302A, 302B, 302C, 302D, 302E, 302F and 302G which are separated apart from each other by six second gaps 312. In other embodiments, the shape of the second gap 312 is not limited to a linear shape, and the division manner is not limited to that shown in the above embodiments. Any division manner which may divide the second region 302 of the conductive layer M into a plurality of the sections which are separated apart from each other may be used in the present disclosure.

In summary, by electrically connecting the driving unit to the gate-driving circuit through the test pad, the present disclosure may reduce the area occupied by the wire in the driving unit. Therefore, the problem of insufficient area for the wire in the driving unit happened as the resolution of the display panel is enhanced may be solved. In addition, the present disclosure utilizes the patterned test pad to limit the corrosion that can happen after the testing step in a portion of the patterned test pad, which in turn improves the reliability and yield of the display device.

The disclosure provides a display device that has a fanout area with circuits that are integrated to a high degree in order to reduce the space occupied by the fanout area. Therefore, a display device of a fixed size can have a larger display region.

In addition, according to an embodiment of the disclosure, the display device of the disclosure can further include a first conductive loop, having a plurality of conductive blocks, outside the display region, in order to protect the display device from damage caused by electrostatic discharge during the process.

Moreover, according to an embodiment of the disclosure, the display device of the disclosure can further include a second conductive loop outside the display region, wherein a sealant is disposed over the second conductive loop and close to the peripheral boundary of the display device, in order to achieve a high electrostatic discharge ability.

Figure 18:
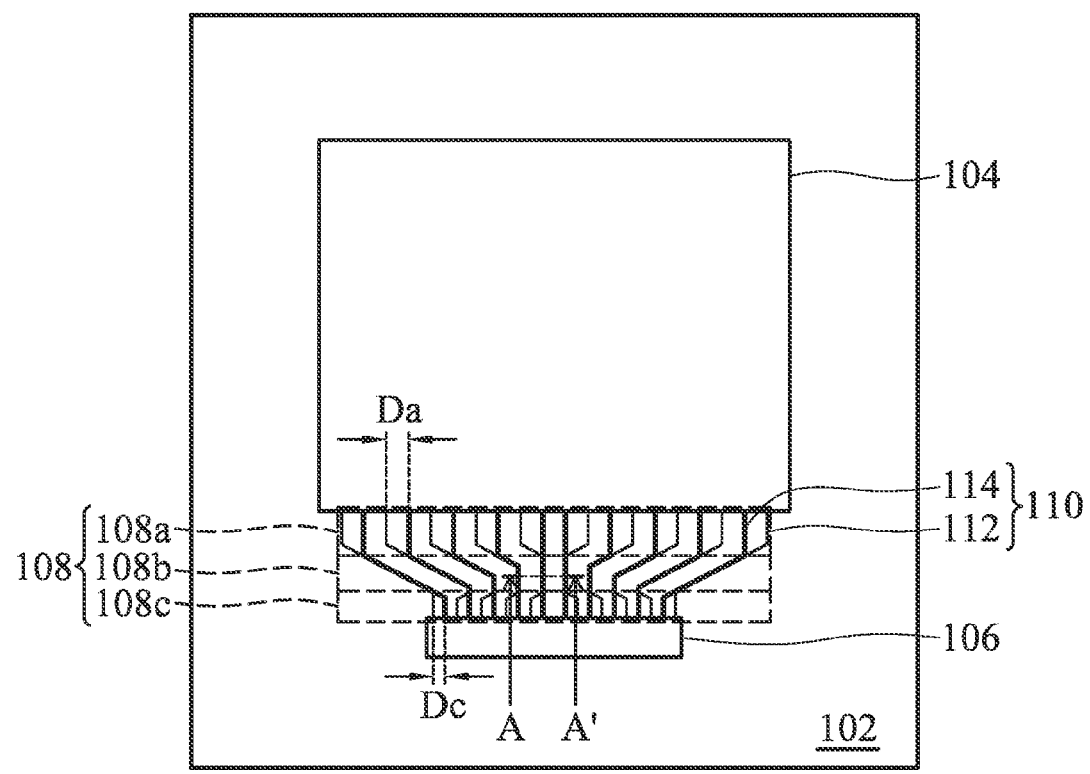
FIG. 18 is a top view of a display device according to an embodiment of the disclosure.

FIG. 18 shows a top-view of a display device according to an embodiment of the disclosure. The display device 100 includes a display region 104 and a driving element 106 disposed on a substrate 102. The display device 100 can be a liquid-crystal display (such as thin film transistor liquid-crystal display), or an organic electroluminescent display (such as active full-color organic electroluminescent display). The display region 104 has a plurality of pixels (not shown), and the driving element 106 is electrically connected to the display region 104 via a plurality of signal line pairs 110, in order to provide input to the pixels of the display region 104 so that the display device can display images. In particular, the display region 104 is separated from the driving element 106 by a fanout area 108, and a plurality of signal line pairs 110 are disposed on the fanout area 108. At least one of the signal line pairs 110 includes a first conductive line 112 and a second conductive line 114, wherein the first conductive line 112 and the second conductive line 114 are electrically isolated from each other. The first conductive line 112 and the second conductive line 114 transmit different signals. For example, each of the pixels disposed in the display region 104 can have at least three sub-pixels (such as a red sub-pixel, a blue sub-pixel, and a green sub-pixel; or a red sub-pixel, a blue sub-pixel, a green sub-pixel, and a white sub-pixel), and the various signals produced by the driving element 106 are transmitted to the sub-pixels via the first conductive lines 112 and second conductive lines 114. In addition, in the fanout area 108, at least a part of the first conductive line 112 overlaps with the second conductive line 114.

As shown in FIG. 18, the fanout area 108 can be defined as a first circuit area 108a, a second circuit area 108b, and a third circuit area 108c, wherein the first circuit area 108a is adjacent to the display region 104, the third circuit area 108c is adjacent to the driving element 106, and the second circuit 108b area disposed between the first circuit area 108a and third circuit area 108c.

According to an embodiment of the disclosure, in the first circuit area 108a, the first conductive line 112 and the adjacent second conductive line 114 are separated by a distance (minimum horizontal distance) Da. Namely, the first conductive block 112 and the second conductive block 114 adjacent to the first conductive block 112 are separated from each other. In the third circuit area 108c, the first conductive line 112 and the adjacent second conductive line 114 are separated by a distance (minimum horizontal distance) Dc. In particular, the distance Da (the distance between the first conductive block 112 and the second conductive block 114 adjacent to the first conductive block 112) can be from 3 to 40 µm, the distance Dc can be from 3 µm to 18 µm, and the distance Da is longer than the distance Dc.

Figure 19A:
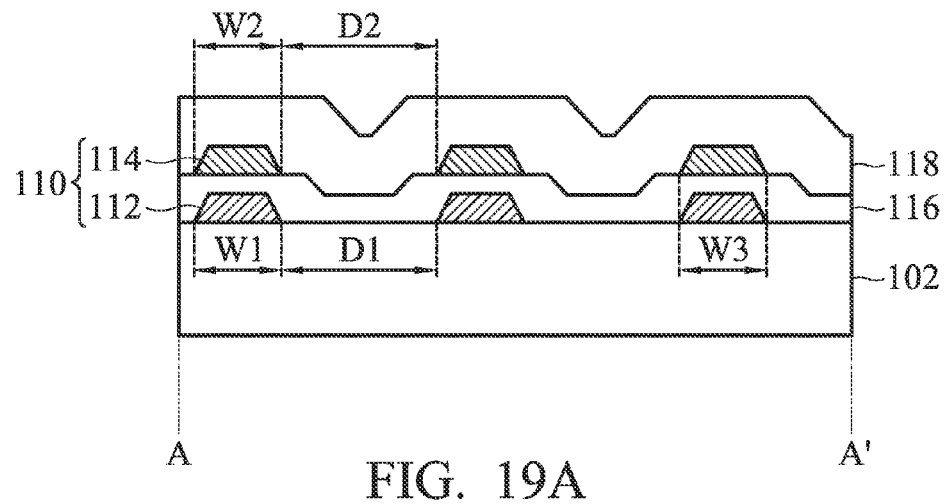
FIG. 19A is a cross-sectional view of the display device shown in FIG. 18 along the line A-A'.

FIG. 19A shows a cross-sectional view of FIG. 18 along line A-A'. As shown in FIG. 19A, in the second circuit area 108b, the first conductive line 112 and the second conductive line 114 of the same signal line pair 110 can partially overlap each other. As a result, the horizontal projection area of the first conductive line 112 and the second conductive line 114 can be reduced, and the degree of integration of the fanout area 108 can be increased.

As shown in FIG. 19A, the first conductive line 112 can be disposed on the substrate 102. A dielectric layer 116 can be disposed on the substrate 102 to cover the first conductive line 112. The second conductive line 114 can be disposed on the dielectric layer 116, and the first conductive line 112 can overlap with the second conductive line 114. A passivation layer 118 can be disposed on the dielectric layer 116 to cover the second conductive line 114. In particular, the substrate 102 can be quartz, glass, silicon, metal, plastic, or ceramic. Suitable materials for the first conductive lines 112 and the second conductive lines 114 include a single-layer or multilayer metal conductive material (such as aluminum (Al), copper (Cu), molybdenum (Mo), titanium (Ti), platinum (Pt), iridium (Ir), nickel (Ni), chromium (Cr), silver (Ag), gold (Au), tungsten (W), or an alloy thereof), metal-containing conductive material (such as: aluminum-containing compound, copper-containing compound, molybdenum-containing compound, titanium-containing compound, platinum-containing compound, iridium-containing compound, nickel-containing compound, chromium-containing compound, silver-containing compound, gold-containing compound, tungsten-containing compound, magnesium-containing compound, or a combination thereof), or a combination thereof. Furthermore, the first conductive line 112 and the second conductive line 114 can be made of the same or different material. The dielectric layer 116 can be silicon nitride, silicon oxide, silicon oxynitride, silicon carbide, aluminum oxide, or a combination thereof. The passivation layer 118 can be made of organic insulating materials (such as photosensitive resins) or inorganic insulating materials (such as silicon nitride, silicon oxide, silicon oxynitride, silicon carbide, aluminum oxide, or a combination thereof), in order to isolate the first conductive line 112 and the second conductive line 114 from air and moisture. In addition, according to an embodiment of the disclosure, the first conductive line 112 and the second conductive line 114 have tapered sidewalls, as shown in FIG. 19A. In particular, the tapered sidewall of the first conductive line 112 or the second conductive line 114 has an inclination angle of 15 to 90° from horizontal. Furthermore, the inclination angle of the first conductive line 112 can be equal to or different from that of the second conductive line 114.

Figure 19B:
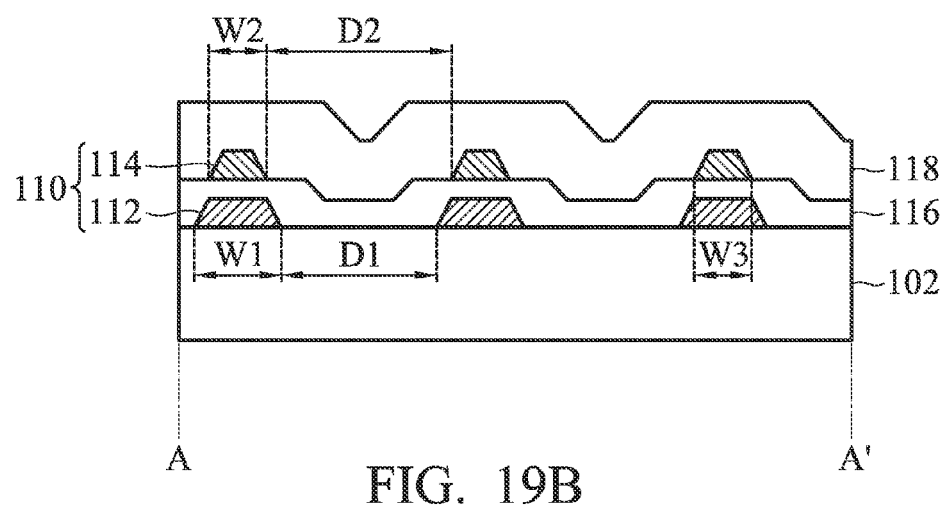
FIGS. 19B and 19C are cross-sectional views of the display devices according to some embodiments of the disclosure along the line A-A' of FIG. 1.

According to an embodiment of the disclosure, the width W1 of the first conductive line 112 can be from 2 to 10 μm, the width W2 of the second conductive line 114 can be from 2 to 10 μm, and the width W1 can be equal to the width W2 (as shown in FIG. 19A). Furthermore, the width W1 of the first conductive line 112 can be different from the width W2 of the second conductive line 114 (as shown in FIG. 19B). Namely, the ratio of the width W1 of the first conductive line 112 to the width W2 of the second conductive line 114 is from 1 to 5. For example, as shown in FIG. 19B, the width W1 of the first conductive line 112 can be larger than the width W2 of the second conductive line 114. In addition, as shown in FIGS. 19A and 19B, the second conductive line 114 can completely overlap with the first conductive line 112 (i.e., the horizontal projection of the second conductive line 114 can completely overlap the horizontal projection of the first conductive line 112).

According to an embodiment of the disclosure, in the second circuit area 108b, any two adjacent first conductive lines 112 are separated by a distance D1 (i.e., the minimum horizontal distance between the two adjacent first conductive lines 112 in the second circuit area 108b). Furthermore, in the second circuit area 108b, any two adjacent second conductive lines 114 are separated by a distance D2 (i.e., the minimum horizontal distance between the two adjacent second conductive lines 114 in the second circuit area 108b). In particular, the distance D1 can be from 2 to 30 μm, and the distance D2 can be from 2 to 30 μm.

According to an embodiment of the disclosure, in the second circuit area 108b, the sum (W1+D1) of the width W1 of the first conductive line 112 and the distance D1 can be equal to the sum (W2+D2) of the width W2 of the second conductive line 114 and the distance D2. In addition, the ratio (D1/(W1+D1)) of the distance D1 and the sum of the distance D1 and the width W1 can be from 0.1 to 0.66. When the ratio (D1/(W1+D1)) is greater than or equal to 0.1, a sealant (not shown) subsequently formed within the second circuit area 108b is apt to be completely cured after a curing process (irradiating an energy from the substrate 102 side). On the other hand, when the ratio (D1/(W1+D1)) is less than or equal to 0.66, the degree of integration of conductive lines of the second circuit area 108b can be increased.

According to embodiments of the disclosure, the overlapping portion of the first conductive line 112 and the second conductive line 114 (i.e., the overlapping portion of the horizontal projection of the first conductive line 112 and the horizontal projection of the second conductive line 114) has a width W3 (i.e., the minimum horizontal width). Furthermore, the ratio (W3/W1) of the width W3 and the width W1 of the first conductive line 112 is from 0.3 to 1.

Figure 19C:
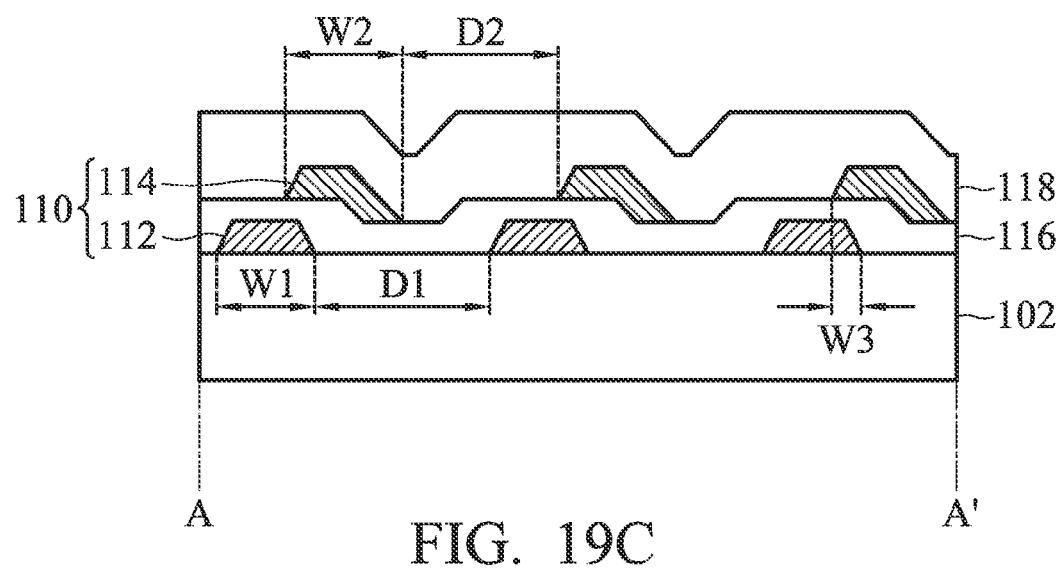

With respect to the signal line pair 110 in the second circuit area 108b, at least a part of the first conductive line 112 can overlap with the second conductive line 114 (i.e., at least a part of the horizontal projection of the first conductive line 112 can overlap the horizontal projection of the second conductive line 114), as shown in FIG. 19C. Herein, the relationship between the width W1 of the first conductive line 112, the width W2 of the second conductive line 114, and the width W3 can be defined by the following equation:

$(W1+W2-W3)/W1 \geq 1$

Figure 20:
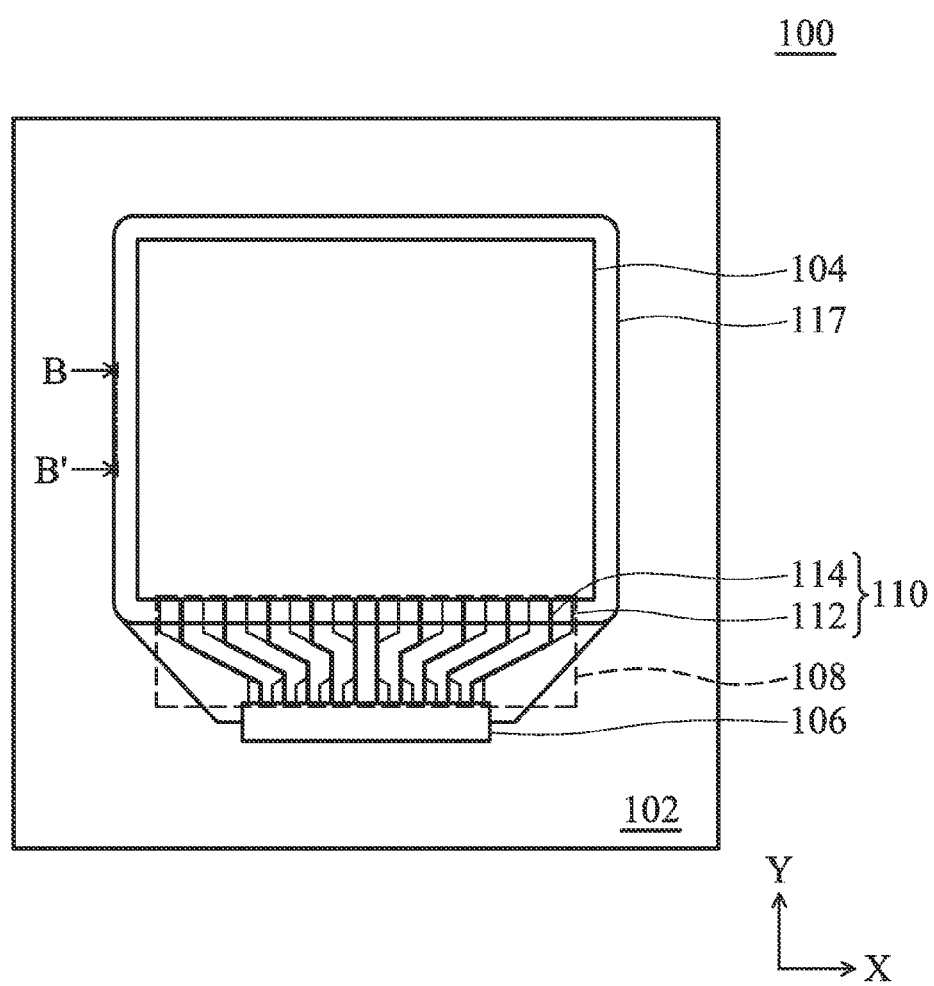
FIG. 20 is a top view of a display device according to another embodiment of the disclosure.

FIG. 20 is a top-view of a display device 100 according to an embodiment of the disclosure. Besides the display region 104, the driving element 106, and the fanout area 108, the display device 100 further includes a first conductive loop 117 disposed outside the display region 104. As shown in FIG. 20, the first conductive loop 117 can be disposed on the substrate 102 and surround the display region 104. Furthermore, the first conductive loop 117 can be electrically connected to the driving element 106, and the driving element 106 can provide a voltage signal to the first conductive loop 117 in order to force the first conductive loop 117 to generate a reference voltage. Since the first conductive loop 117 would overlap with the signal line pairs 110 in the fanout area 108, another conducting layer can be used as a substitute for the first conductive loop 117 or the signal line pairs 110 in order to avoid contact between the first conductive loop 117 and the signal line pairs 110.

Figure 21A:
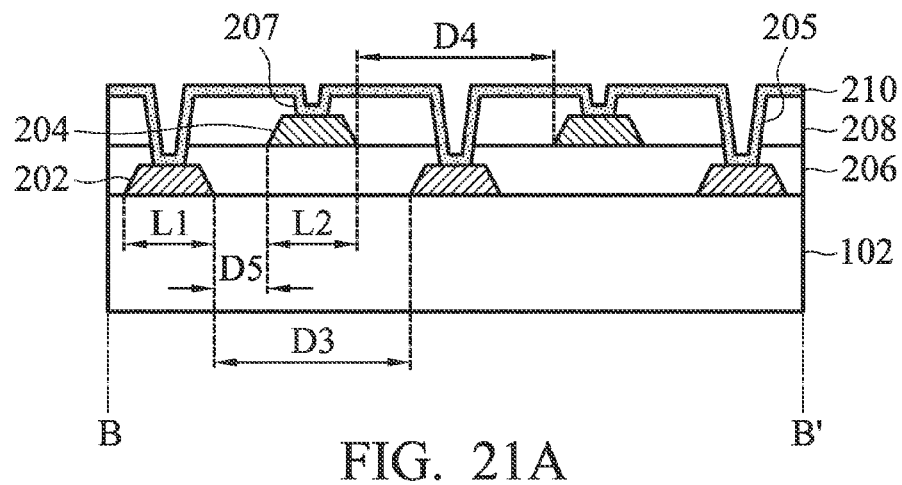
FIG. 21A is a cross-sectional view of the display device shown in FIG. 20 along the line B-B'.

According to an embodiment of the disclosure, at least a part of the first conductive loop 117 includes a plurality of first conductive blocks 202 and a plurality of second conductive blocks 204. The first conductive blocks 202 and the second conductive blocks 204 are electrically connected to each other. FIG. 21A shows a cross-sectional view of the display device 100 of FIG. 20 along line B-B'. According to an embodiment of the disclosure, the part of the first conductive loop 117 including the plurality of first conductive blocks 202 and the plurality of second conductive blocks 204 can be disposed on the two opposite sides of the display region 104, and the part of the first conductive loop 117 can be perpendicular to a first axis X (i.e. parallel to a second axis Y). In an embodiment of the disclosure, since there are a plurality of data lines (not shown) disposed on the two opposite sides of the display region 104 corresponding to the first axis X (i.e. the plurality of data lines perpendicular to the first axis X), the part of the first conductive loop 117 including the plurality of first conductive blocks 202 and the plurality of second conductive blocks 204 is not apt to be disposed parallel to the first axis X. In some embodiments of the disclosure, the part of the first conductive loop 117 including the plurality of first conductive block 202 and the plurality of second conductive block 204 can also be disposed on the two opposite sides of the display region 104 and parallel to a first axis X.

As shown in FIG. 21A, the plurality of first conductive blocks 202 can be disposed on the substrate 102. A dielectric layer 206 can be disposed on the substrate 102 to cover the first conductive blocks 202. The plurality of second conductive blocks 204 can be disposed on the dielectric layer 206. A passivation layer 208 can be disposed on the dielectric layer 206 to cover the second conductive blocks 204. In addition, a plurality of first via holes 205 pass through the dielectric layer 206 and the passivation layer 208, exposing the first conductive block 202. A plurality of second via holes 207 pass through the passivation layer 208, exposing the second conductive block 204. A conducting layer 210 can be disposed on the passivation layer 208 to fill into the first via hole 205 and the second via hole 207, resulting in the plurality of first conductive blocks 202 and the plurality of second conductive blocks 204 being electrically connected to each other via the conducting layer 210.

According to an embodiment of the disclosure, the first conductive block 202 and the second conductive block 204 can be a made of single-layer or multilayer metal conductive material (such as aluminum (Al), copper (Cu), molybdenum (Mo), titanium (Ti), platinum (Pt), iridium (Ir), nickel (Ni), chromium (Cr), silver (Ag), gold (Au), tungsten (W), or an alloy thereof), metal-containing conductive material (such as: aluminum-containing compound, copper-containing compound, molybdenum-containing compound, titanium-containing compound, platinum-containing compound, iridium-containing compound, nickel-containing compound, chromium-containing compound, silver-containing compound, gold-containing compound, tungsten-containing compound, magnesium-containing compound, or a combination thereof), or a combination thereof. Furthermore, the materials of the first conductive blocks 202 and the second conductive blocks 204 can be the same or different. According to an embodiment of the disclosure, the first conductive blocks 202 and the first conductive line 112 can be formed in the same process and made of the same material; and/or, the second conductive blocks 204 and the second conductive line 114 can be formed in the same process and made of the same material. The dielectric layer 206 can be silicon nitride, silicon oxide, silicon oxynitride, silicon carbide, aluminum oxide, or a combination thereof. Furthermore, the dielectric layer 206 and the dielectric layer 116 can be formed in the same process and made of the same material. The passivation layer 208 can be organic insulating materials (such as photosensitive resins) or inorganic insulating materials (such as silicon nitride, silicon oxide, silicon oxynitride, silicon carbide, aluminum oxide, or a combination thereof). The passivation layer 208 and the passivation layer 118 can be formed in the same process and made of the same material. In addition, the conducting layer 210 can be a single-layer or multilayer transparent conducting layer, and the material of the conducting layer 210 can be ITO (indium tin oxide), IZO (indium zinc oxide), AZO (aluminum zinc oxide), ZnO (zinc oxide), tin oxide, indium oxide, or a combination thereof.

As shown in FIG. 21A, in order to protect the display device 100 from damage caused by electrostatic discharge during the fabrication of the display device, the first conductive block 202 can have a length L1 between 10 and 10000 μm, and the second conductive block 204 can have a length L2 between 10 and 10000 μm. In addition, any two adjacent first conductive blocks 202 are separated by a distance D3, any two adjacent second conductive blocks 204 are separated by a distance D4, and any two adjacent first and second conductive blocks 202 and 204 are separated by a distance D5. In particular, the distance D3 is from 16 to 100 μm, the distance D4 is from 16 to 100 μm, and the distance D5 is from 3 to 40 μm.

Figure 21B:
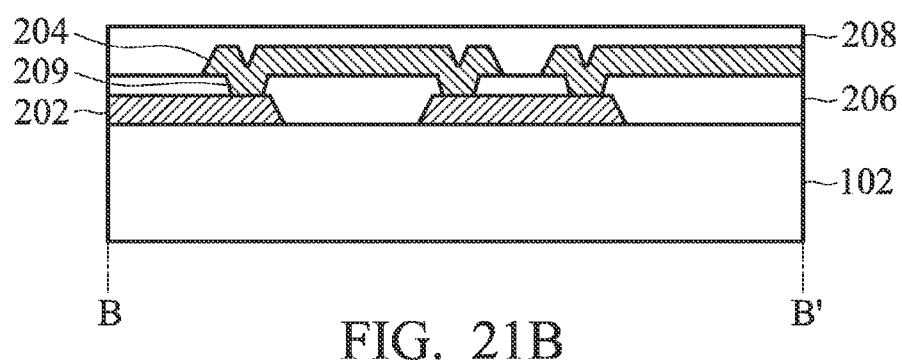
FIGS. 21B and 21C are cross-sectional views of the display devices according to some embodiments of the disclosure along the line B-B' of FIG. 20.

According to another embodiment of the disclosure, any two adjacent first conductive blocks 202 can be electrically connected to each other via the second conductive block 204 adjacent to the two adjacent first conductive blocks 202. As shown in FIG. 21B, the plurality of first conductive blocks 202 can be disposed on the substrate 102. The dielectric layer 206 can be disposed on the substrate 102 to cover the first conductive block 202. A plurality of third via holes 209 pass through the dielectric layer 206 exposing the first conductive block 202. The plurality of second conductive blocks 204 can be disposed on the dielectric layer 206 to fill into the third via hole 209, forcing the second conductive block 204 to overlap with the two first conductive block 202 adjacent to the second conductive block 204. Therefore, the first conductive blocks 202 and the second conductive blocks 204 can be electrically connected to each other in the absence of the conducting layer 210.

Figure 21C:
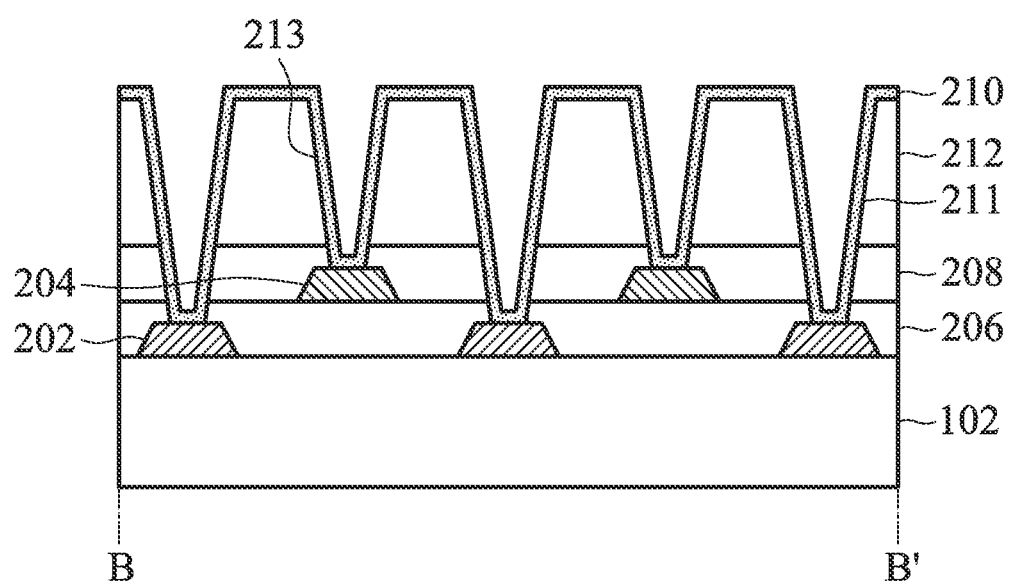

According to other embodiments of the disclosure, as shown in FIG. 21C, a planarization layer 212 can be further formed on the passivation layer 208. A plurality of fourth via holes 211 pass through the dielectric layer 206, the passivation layer 208, and the planarization layer 212, exposing the first conductive blocks 202. A plurality of fifth via holes 213 pass through the passivation layer 208 and the planarization layer 212, exposing the second conductive blocks 204. The conducting layer 210 can be formed on the planarization layer 212 to be filled into the fourth via hole 211 and the fifth via hole 213, resulting in the first conductive blocks 202 and the second conductive blocks 204 being electrically connected to each other via the conducting layer 210. In particular, the planarization layer 212 can be a layer with insulating properties, such as a dielectric material, or photosensitive resin.

Figure 22:
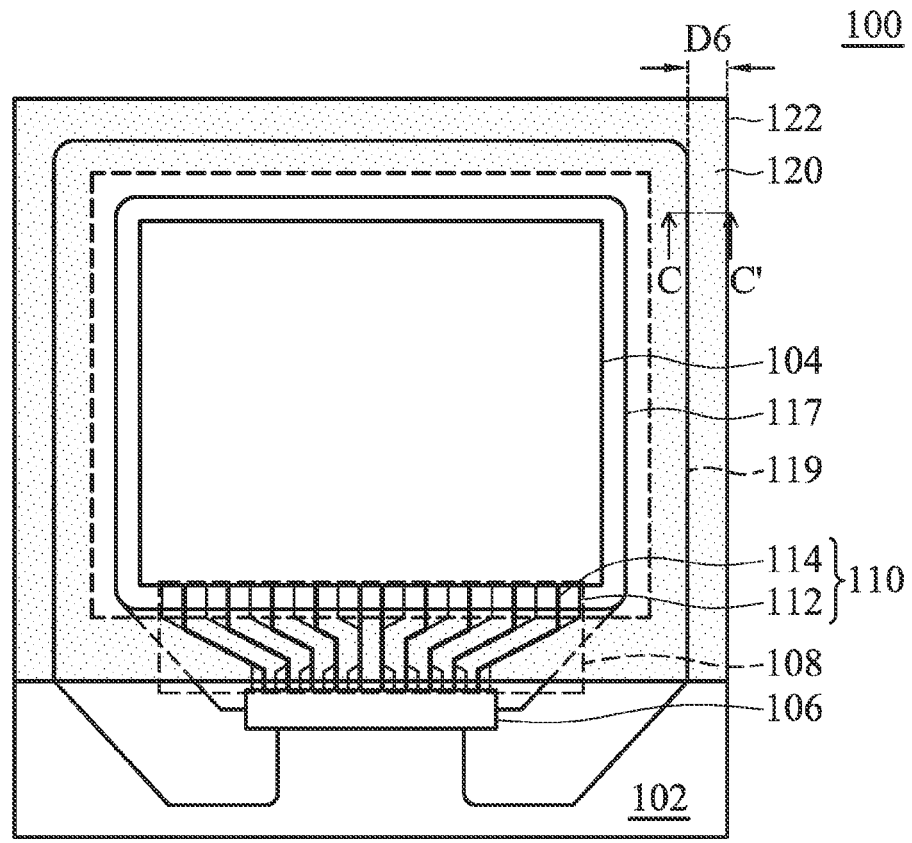
FIG. 22 is a top view of a display device according to still another embodiment of the disclosure.

FIG. 22 shows a top view of the display device 100 according to an embodiment of the disclosure. In addition to the display region 104, the driving element 106, the fanout area 108, and the first conductive loop 117, the display device 100 can further include a second conductive loop 119. The second conductive loop 119 can be disposed on substrate 102 outside the display region 104 and the first conductive loop 117. As shown in FIG. 22, the second conductive loop 119 can be disposed on the substrate 102 to surround the display region 104 and connect to the driving element 106. The second conductive loop 119 can serve as an electrostatic discharge (ESD) protection element, protecting the pixels within the display region 104 from damage caused by electrostatic discharge. In addition, a sealant 120 can be disposed on the substrate 102 to cover a part of the second conductive loop 119. In particular, a region defined by projecting the sealant 120 to the substrate 102 serves as a package region (not shown). The second conductive loop 119 within the package region is completely covered by the sealant 120.

The second conductive loop 119 can be single-layer or multilayer metal conductive material (such as aluminum (Al), copper (Cu), molybdenum (Mo), titanium (Ti), platinum (Pt), iridium (Ir), nickel (Ni), chromium (Cr), silver (Ag), gold (Au), tungsten (W), or an alloy thereof), metal-containing conductive material (such as aluminum-containing compound, copper-containing compound, molybdenum-containing compound, titanium-containing compound, platinum-containing compound, iridium-containing compound, nickel-containing compound, chromium-containing compound, silver-containing compound, gold-containing compound, tungsten-containing compound, magnesium-containing compound, or a combination thereof), or a combination thereof. According to an embodiment of the disclosure, the second conductive loop 119 can be formed simultaneously during the process for forming the first conductive blocks 202 and the second conductive blocks 204. In addition, the sealant can be a resin.

Figure 23:
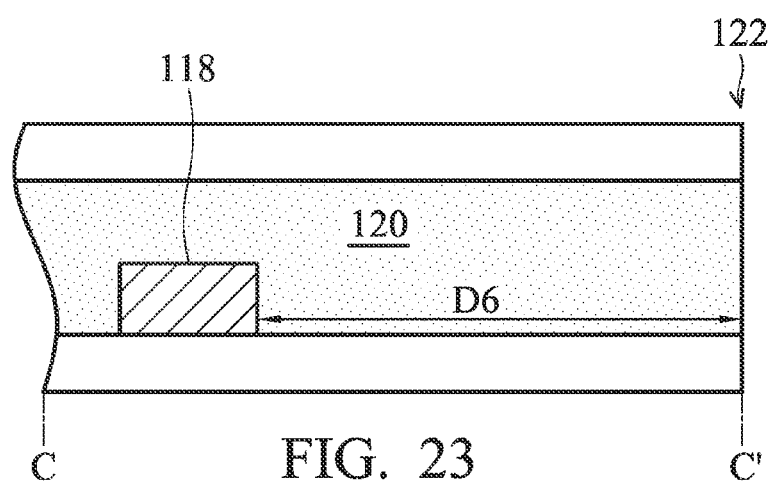
FIG. 23 is a cross-sectional view of the display device shown in FIG. 22 along the line C-C'.

As shown in FIG. 22, the display device 100 has a peripheral boundary 122. In the package region, there is no distance between the sealant 120 and the peripheral boundary 122 (the horizontal distance between the sealant 120 and the peripheral boundary 122 is 0). FIG. 23 is a cross-sectional view of the display device 100 as shown in FIG. 22 along line C-C'. As shown in FIG. 23, the second conductive loop 119 and the peripheral boundary 122 are separated by a distance D6, and the sealant 120 is disposed on the second conductive loop 119 within the peripheral boundary 122. Namely, the space between the second conductive loop 119 and the peripheral boundary 122 is filled with the sealant 120. It should be noted that the distance D6 is from 50 to 300 μm in order to protect the second conductive loop 119 from erosion and corrosion by moisture and air and achieve the electrostatic discharge (ESD) protection ability of the second conductive loop 119.

Figure 24:
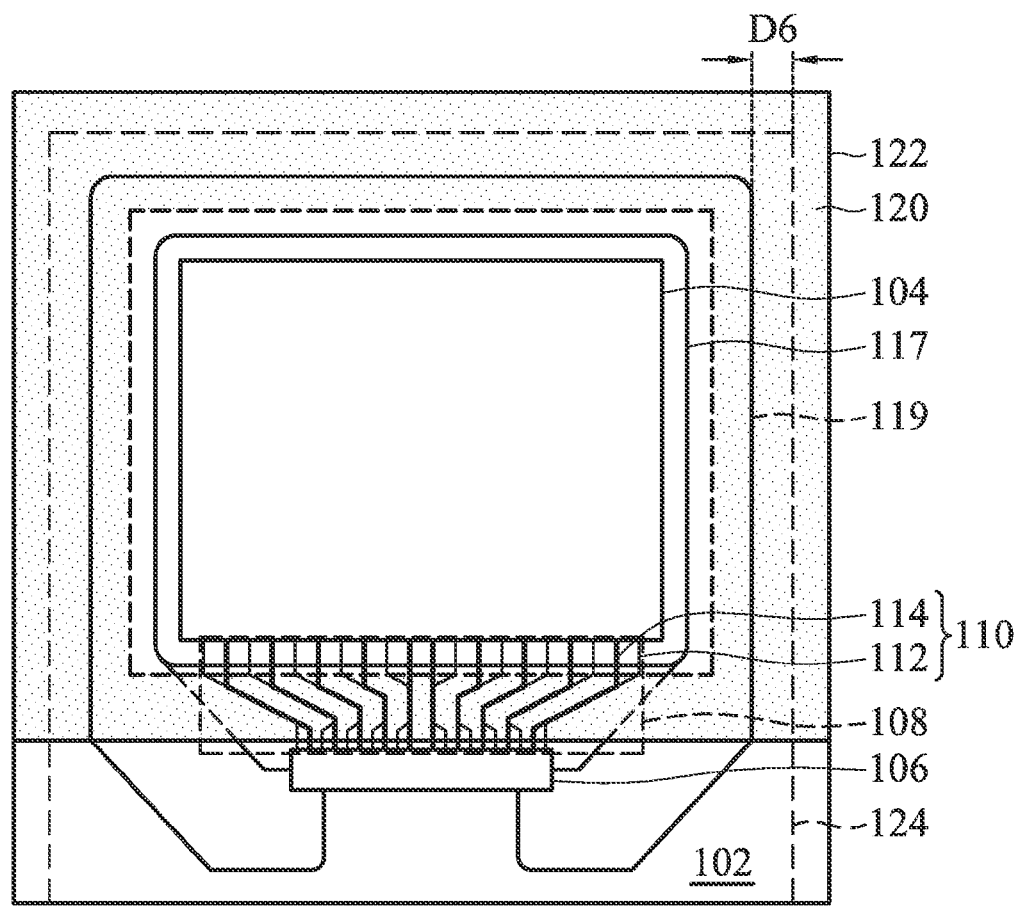
FIGS. 24 and 25 are top views of display device main substrates according to embodiments of the disclosure.

In order to ensure that the second conductive loop 119 is not left uncovered by the sealant 120 due to a processing error, a so-called "cutting-on-sealant process" is employed during the processes for fabricating the display device of the disclosure. FIG. 24 shows a schematic top view of a display device main substrate 201 according to an embodiment of the disclosure. The display device as shown in FIG. 22 can be obtained after cutting the display device main substrate 201 via a cutting process. As shown in FIG. 24, when forming the sealant 120 on the substrate 102, the sealant 120 is formed to cover the predetermined cutting line 124. Therefore, after performing the cutting process (using for example, a single-tool cutting process, a multi-tool cutting process, or a laser cutting process) along the predetermined cutting line 124, there is no distance between the peripheral boundary 122 and the sealant 120 of the obtained display device 100 (such as the display device 100 as shown in FIG. 22). Furthermore, the second conductive loop 119 is separated from the peripheral boundary 122 by the distance D6. As shown in FIG. 24, the sealant 120 can be formed to contact the peripheral boundary 122.

Figure 25:
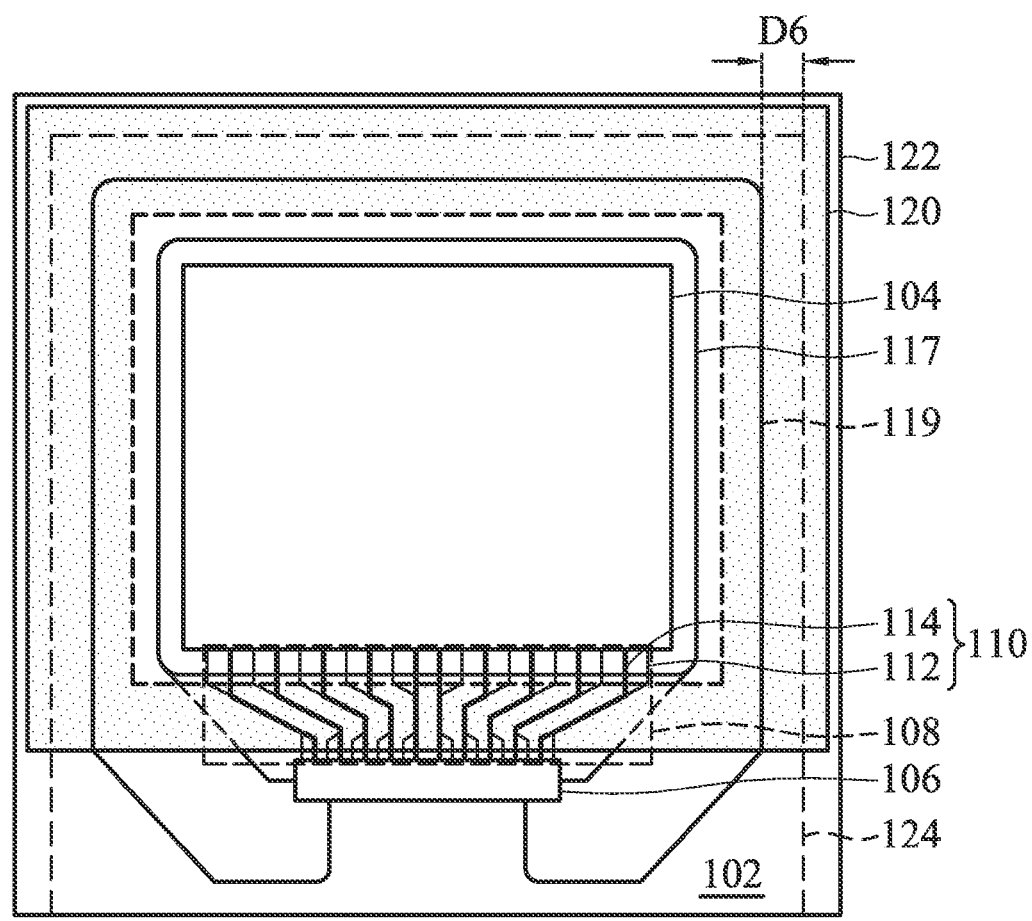

In addition, according to an embodiment of the disclosure, when forming the sealant 120 on the substrate 102, the sealant 120 can cover the predetermined cutting line 124 and not contact the peripheral boundary 122, as shown in FIG. 25. After performing the cutting process along the predetermined cutting line 124, the display device 100 as shown in FIG. 22 can be still obtained.

Accordingly, the area occupied by the fanout area of the display device of the disclosure can be lowered resulting from increasing the conductive line degree of integration in the fanout area. Therefore, a display device of a fixed size can have a high resolution. In addition, the display device of the disclosure can further include a first conductive loop outside the display region, wherein the first conductive loop includes a plurality of conductive blocks. Therefore, the first conductive loop can protect the display device from damage caused by electrostatic discharge during the fabrication of the display device. Moreover, the display device of the disclosure can further include a second conductive loop outside the display region, wherein a sealant is disposed on the second conductive loop and within the peripheral boundary of the display device, in order to achieve high electrostatic discharge ability of the second conductive loop.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A display device, comprising: a first substrate, wherein a display region is disposed above the first substrate; a second substrate; a sealant disposed between the first substrate and the second substrate and outside the display region; and a plurality of spacers disposed within the sealant, wherein the first substrate has a side wall comprising a first cutting crack surface and a first median crack surface, and a roughness of the first cutting crack surface is different from that of the first median crack surface, wherein the sealant comprises a stable cutting region, the plurality of spacers are disposed within the stable cutting region, and the stable cutting region is adjacent to the peripheral boundary of the display device, wherein a ratio between an area occupied by the spacers and the stable cutting region is from 1% to 5%.

2. The display device as claimed in claim 1, wherein a ratio of a total thickness of the first cutting crack surface and the first median crack surface to a thickness of the first substrate is between 0.3 and 1.

3. The display device as claimed in claim 1, wherein a first angle defined by the first cutting crack surface and the first median crack surface is larger than 90 degrees and less than 270 degrees.

4. The display device as claimed in claim 1, wherein the second substrate has a side wall comprising a second cutting crack surface and a second median crack surface, and a roughness of the second cutting crack surface is different from that of the second median crack surface.

5. The display device as claimed in claim 1, wherein the stable cutting region has a width between 50 μm and 150 μm.

6. The display device as claimed in claim 1, wherein a distance between one of the plurality of spacers and the side wall of the second substrate is from 0 to 200 μm, and a distance between the one of the plurality of spacers and the side wall of the first substrate is greater than the distance between the one of the plurality of spacers and the side wall of the second substrate.

7. The display device as claimed in claim 1, wherein a planarization layer is disposed between the first substrate and the sealant.

8. The display device as claimed in claim 7, wherein the plurality of spacers are disposed on the planarization layer, and the plurality of spacers are disposed between the second substrate and the planarization layer.

9. The display device as claimed in claim 1, wherein the sealant comprises a linear portion and an U-shaped portion, wherein a distance between the display region and a sealant border, which is disposed between the linear portion and the U-shaped portion, is greater than a distance between the display region and the linear portion.

10. The display device as claimed in claim 1, further comprising:
a test circuit disposed along edges of the first substrate which is substantially coincided with edges of the second substrate, and a first contacting pad is electrically connected to a second contacting pad via the test circuit, and the first contacting pad and the second contacting pad are disposed outside the display region.

11. A display device, comprising:
a first substrate, wherein a display region is disposed above the first substrate, and wherein the first substrate has a side wall comprising a first cutting crack surface and a first median crack surface, and a roughness of the first cutting crack surface is different from that of the first median crack surface;
a second substrate;
a sealant disposed between the first substrate and the second substrate and outside the display region; and
a first contacting pad and a second contacting pad disposed on the first substrate and outside the display region;

a test circuit disposed along edges of the first substrate which is substantially coincided with edges of the second substrate, and the first contacting pad is electrically connected to the second contacting pad via the test circuit; and a first circuit and a second circuit, wherein the first circuit electrically connects to the first contacting pad, and the second circuit electrically connects to the second contacting pad, wherein the first circuit and the second circuit are disposed on a circuit board.

12. The display device as claimed in claim 11, further comprising:

a driving element electrically connected to the first contacting pad and the second contacting pad, wherein the driving element provides a signal to the first contacting pad and the second contacting pad.

13. The display device as claimed in claim 12, wherein the signal is a common electrode voltage signal or a ground voltage signal.

14. The display device as claimed in claim 11, wherein the sealant consists of a linear portion and an U-shaped portion, wherein a distance between the display region and a sealant border, which is disposed between the linear portion and the U-shaped portion, is greater than a distance between the display region and the linear portion.

15. The display device as claimed in claim 11, wherein the sealant comprises a stable cutting region, a plurality of spacers are disposed on the stable cutting region, and the stable cutting region is adjacent to edges of the first substrate which is substantially coincided with edges of the second substrate, and wherein a ratio between an area occupied by the spacers and the stable cutting region is from 1% to 5%.

16. The display device as claimed in claim 15, wherein the stable cutting region has a width between 50 µm and 150 µm.

17. The display device as claimed in claim 11, wherein a ratio of a total thickness of the first cutting crack surface and the first median crack surface to a thickness of the first substrate is between 0.3 and 1.

18. The display device as claimed in claim 11, wherein the second substrate has a side wall comprising a second cutting crack surface and a second median crack surface, and a roughness of the second cutting crack surface is different from that of the second median crack surface.

* * * * *